United States Patent
Box et al.

(10) Patent No.: US 7,506,237 B2
(45) Date of Patent: Mar. 17, 2009

(54) RECONFIGURABLE BIT-MANIPULATION NODE

(75) Inventors: Brian Box, Seabrook, NH (US); John M. Rudosky, Portsmouth, NH (US); Walter James Scheuermann, Saratoga, CA (US)

(73) Assignee: NVIDIA Corporation, Santa Clara, CA (US)

( * ) Notice: Subject to any disclaimer, the term of this patent is extended or adjusted under 35 U.S.C. 154(b) by 9 days.

(21) Appl. No.: 11/682,705

(22) Filed: Mar. 6, 2007

(65) Prior Publication Data

US 2007/0162833 A1  Jul. 12, 2007

Related U.S. Application Data

(62) Division of application No. 10/683,563, filed on Oct. 10, 2003, now Pat. No. 7,197,686.

(60) Provisional application No. 60/418,019, filed on Oct. 11, 2002.

(51) Int. Cl.
*H03M 13/00* (2006.01)
(52) U.S. Cl. .................................... 714/779
(58) Field of Classification Search ............. 714/779
See application file for complete search history.

(56) References Cited

U.S. PATENT DOCUMENTS

| 4,380,046 | A |  | 4/1983 | Frosch et al. |  |
|---|---|---|---|---|---|
| 4,894,819 | A | * | 1/1990 | Kondo et al. | 398/99 |
| 5,138,316 | A | * | 8/1992 | Konishi | 341/67 |
| 5,748,917 | A | * | 5/1998 | Krein et al. | 710/307 |
| 5,784,636 | A |  | 7/1998 | Rupp |  |
| 6,167,550 | A | * | 12/2000 | Gray | 714/769 |
| 6,202,189 | B1 |  | 3/2001 | Hinedi et al. |  |
| 6,311,239 | B1 | * | 10/2001 | Matthews | 710/66 |
| 6,986,142 | B1 |  | 1/2006 | Ehlig et al. |  |
| 7,139,963 | B1 | * | 11/2006 | Fox | 714/758 |

OTHER PUBLICATIONS

Bannatyne, R., "Migrating from 8- to 16-bit processors", Transp. Syst. Group, Motorola Inc., USA, Northcon/98 Conference Proceedings, Oct. 21-23, 1998, pp. 150-158.

* cited by examiner

*Primary Examiner*—Guy J Lamarre
(74) *Attorney, Agent, or Firm*—Patterson & Sheridan, LLP

(57) ABSTRACT

A reconfigurable bit-manipulation node is disclosed that includes an execution unit configured to perform a number of bit-oriented functions and a control unit configured to control the execution unit to allow one of the bit-oriented functions to be performed. The execution unit is comprised of interconnected elements that include a programmable butterfly unit, a number of non-programmable butterfly units, a number of data path elements, a look-up table memory, and a reorder memory. The execution unit is capable of engaging in one of a number of operating modes to perform the bit-oriented functions. The operating modes include a programmable mode and a number of fixed operating modes including Viterbi decoding, turbo decoding and variable length encoding and decoding. The data path elements include a programmable shifter and a programmable combiner.

3 Claims, 20 Drawing Sheets

RECONFIGURABLE BIT-MANIPULATION NODE

CROSS-REFERENCES TO RELATED APPLICATIONS

This application is a divisional of U.S. patent application Ser. No. 10/683,563 filed Oct. 10, 2003, U.S. Pat. No. 7,197,686, which claims the benefit of priority under 35 U.S.C. § 119 from U.S. Provisional Patent Application Ser. No. 60/418,019, entitled "RECONFIGURABLE BIT-MANIPULATION NODE", filed on Oct. 11, 2002, the disclosure of which is hereby incorporated by reference in its entirety for all purposes.

BACKGROUND OF THE INVENTION

The present invention generally relates to a device for providing bit manipulation and, more specifically, to a reconfigurable bit-manipulation node.

There are two basic varieties of bit manipulation. The first type is single bit. In single bit, each bit represents a "hard decision" or, in other words, a "1" or "0". These individual hard decision bits are often found in the transmit portions of communications systems among many others. The second type is multi-bit or "soft decision". Soft decision bits come in many bit widths. Soft decision is common in the receive portions of communications systems where the sampled bit is not known to be a "1" or "0" until processing has been completed.

It would be desirable to have a reconfigurable or programmable bit manipulation node that is capable of providing high performance processing for hard and soft decision data as well as the ability to implement different processing functions on bits when desired.

BRIEF SUMMARY OF THE INVENTION

A reconfigurable bit-manipulation node is disclosed. The node includes an execution unit configured to perform a number of bit-oriented functions and a control unit configured to control the execution unit to allow one of the bit-oriented functions to be performed. The bit-oriented functions include, for example, Viterbi decoding, turbo decoding, variable length encoding and decoding, scrambling, cyclical redundancy check and convolutional encoding.

The execution unit includes a number of elements interconnected with one another to allow the bit-oriented functions to be performed. The elements includes a programmable butterfly unit, a number of non-programmable butterfly units, a number of data path elements, a look-up-table memory and a reorder memory. The execution unit is capable of engaging in one of a number of operating modes to perform the bit-oriented functions. The operating modes include a programmable mode and a number of fixed operating modes.

The fixed operating modes include a Viterbi mode, a soft-in-soft-out mode (turbo decoder), a variable length encoding mode and a variable decoding mode. When engaged in the programmable mode, the execution unit does not utilize any of the non-programmable butterfly units. When engaged in the Viterbi mode, the execution unit utilizes both the programmable butterfly unit and the non-programmable butterfly units and uses the look-up-table memory as a path metric memory and the reorder memory as a trace back memory. When engaged in the soft-in-soft-out mode, the execution unit utilizes both the programmable butterfly unit and three of a number of non-programmable butterfly units. Finally, when engaged in the variable length encoding mode or the variable length decoding mode, the execution unit only uses a subset of operations available from the programmable butterfly unit.

The data path elements include a programmable shifter and a programmable combiner. The programmable shifter is programmable on a cycle-by-cycle basis and configured to perform an exclusive-or function on multiple shifted versions of its inputs. The programmable shifter is further programmable to implement a parallel linear feedback shift register which may be maskable. The programmable combiner is configured to perform packing on an input having variable input lengths to generate an output word having variable output lengths. The programmable combiner is further configured to perform bit interlacing and bit puncturing. Packing, bit interlacing and bit puncturing can be performed concurrently.

The bit-oriented functions are used to handle a number of channel coding schemes including error detecting cyclic codes, error detecting and correcting Hamming codes and single burst error correcting Fire codes.

Reference to the remaining portions of the specification, including the drawings and claims, will realize other features and advantages of the present invention. Further features and advantages of the present invention, as well as the structure and operation of various embodiments of the present invention, are described in detail below with respect to accompanying drawings, like reference numbers indicate identical or functionally similar elements.

DETAILED DESCRIPTION OF THE INVENTION

The present invention in the form of one or more exemplary embodiments will now be described. The purpose of a RBN (Reconfigurable Bit-manipulation Node) is to provide ASIC (Application Specific Integrated Circuit) comparable performance for bit-focused operations while maintaining a reasonable level of programmability or reconfigurability. The reconfigurability can be on an algorithm, task, sub-task, or even a bit basis. Since many bit-oriented functions require significant processing on a DSP (Digital Signal Processor) or microprocessor, the addition of the RBN to an ACM (Adaptive Computing Machine) is beneficial. In an exemplary embodiment, some of the bit-oriented functions performed by the RBN include: Viterbi decoding, turbo decoding, VL (Variable Length) encoding and decoding. In addition, the RBN supports many other functions such as scrambling, CRC (Cyclical Redundancy Check) and convolutional encoding. These various functions performed by the RBN will be further described below.

Overview of the RBN

Figure 1A:
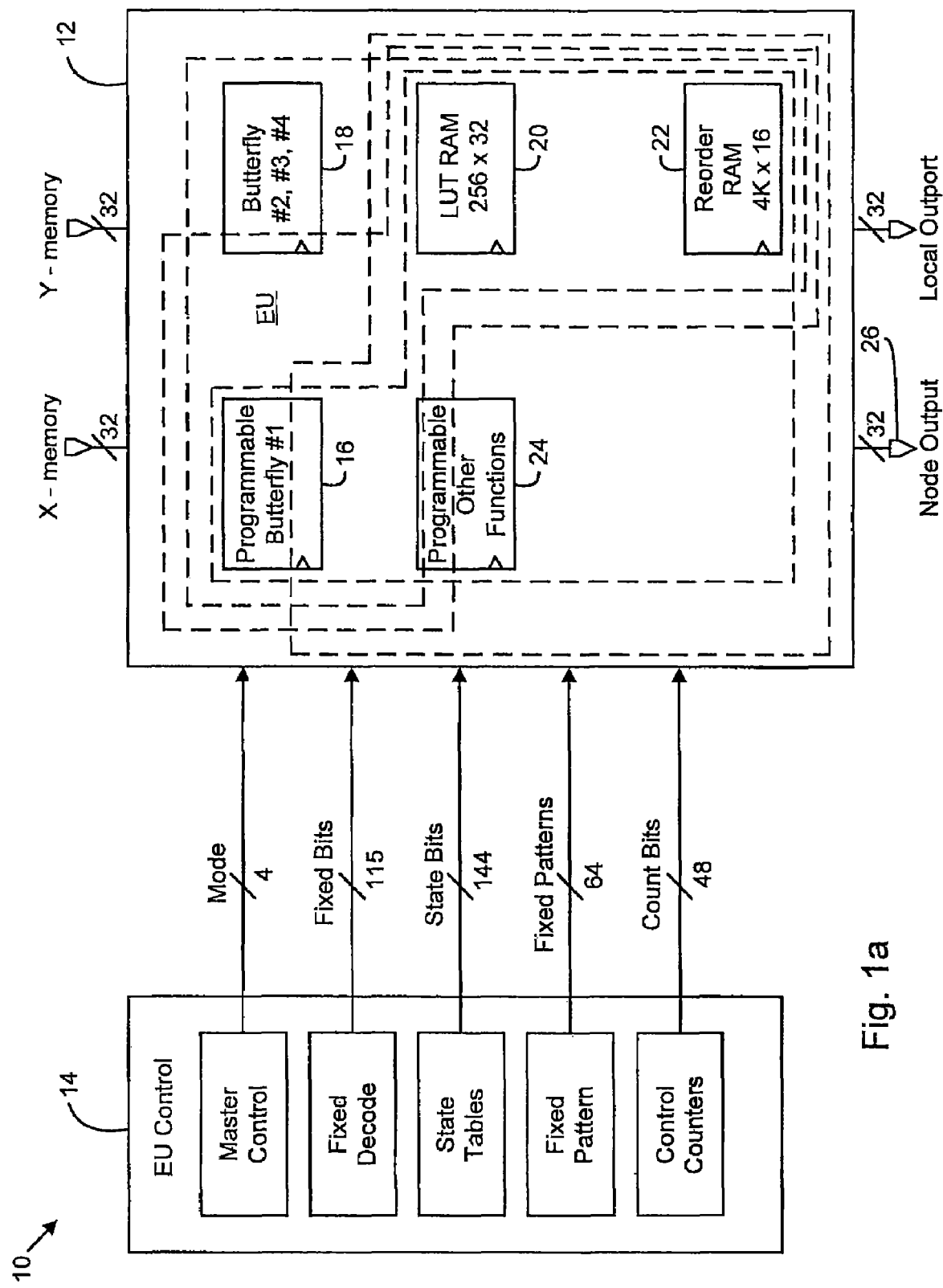
FIG. 1A is a simplified block diagram illustrating one exemplary embodiment of a reconfigurable bit-manipulation node in accordance with the present invention.

FIG. 1A is a simplified block diagram illustrating one exemplary embodiment of the RBN 10 in accordance with the present invention. In one exemplary embodiment as shown in FIG. 1A, the RBN 10 is separated into two main sections, namely, an EU (Execution Unit) 12 and an EU control unit 14. The EU 12 further includes butterfly units and data path elements that perform processing functions and provide storage or interconnections. The EU control unit 14 includes elements that provide for sequencing, function selection, and interconnect selection in support of the EU 12. The EU control unit 14 also implements the control connections to a node wrapper.

In one exemplary embodiment, the EU 12 is made up of five major blocks. These five major blocks include: (1) a programmable butterfly unit 16; (2) a number of butterfly units #2-4 18; (3) a LUT(Look-Up Table) RAM (Random Access Memory) 20; (4) a reorder RAM 22; and (5) a number of data path elements or operators 24.

Figure 1B:
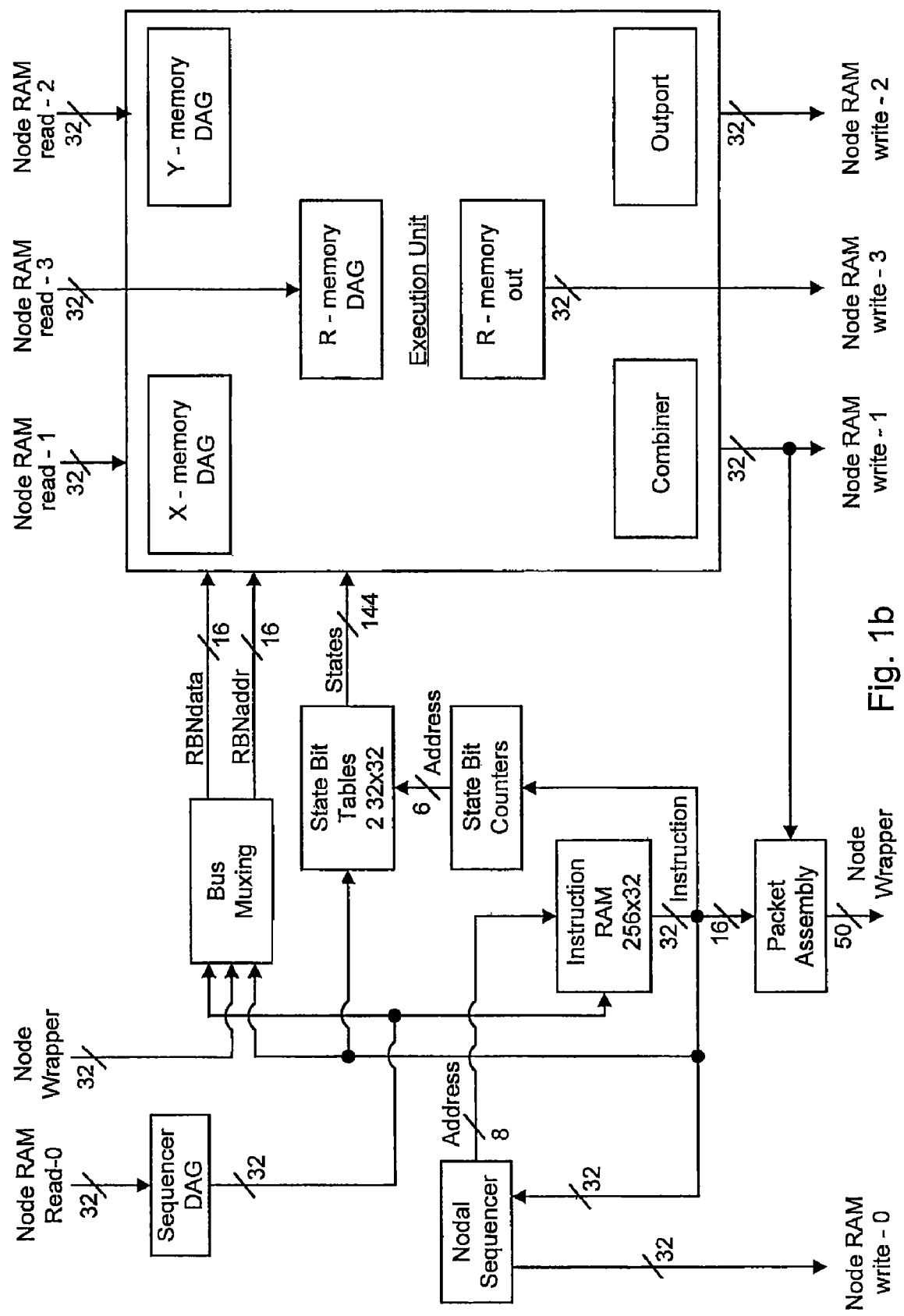
FIG. 1B is a simplified block diagram illustrating another exemplary embodiment of the reconfigurable bit-manipulation node in accordance with the present invention.

In one exemplary aspect, the RBN 10 is capable of engaging in a number of operating modes including one (1) Programmable Mode and four (4) fixed operating modes. The four fixed operating modes are: (1) Viterbi Mode; (2) SISO (Soft In Soft Out) Mode; (3) VL Encoding Mode; and (4) VL Decoding Mode. As shown in FIG. 1A, all the modes receive input data from nodal memory ports, labeled X, and Y, and the outputs are sent to the node wrapper via a node output 26. FIG. 1B is an illustrative diagram showing an alternative exemplary embodiment of the RBN 10 in accordance with the present invention.

Data Path Description

Figure 2:
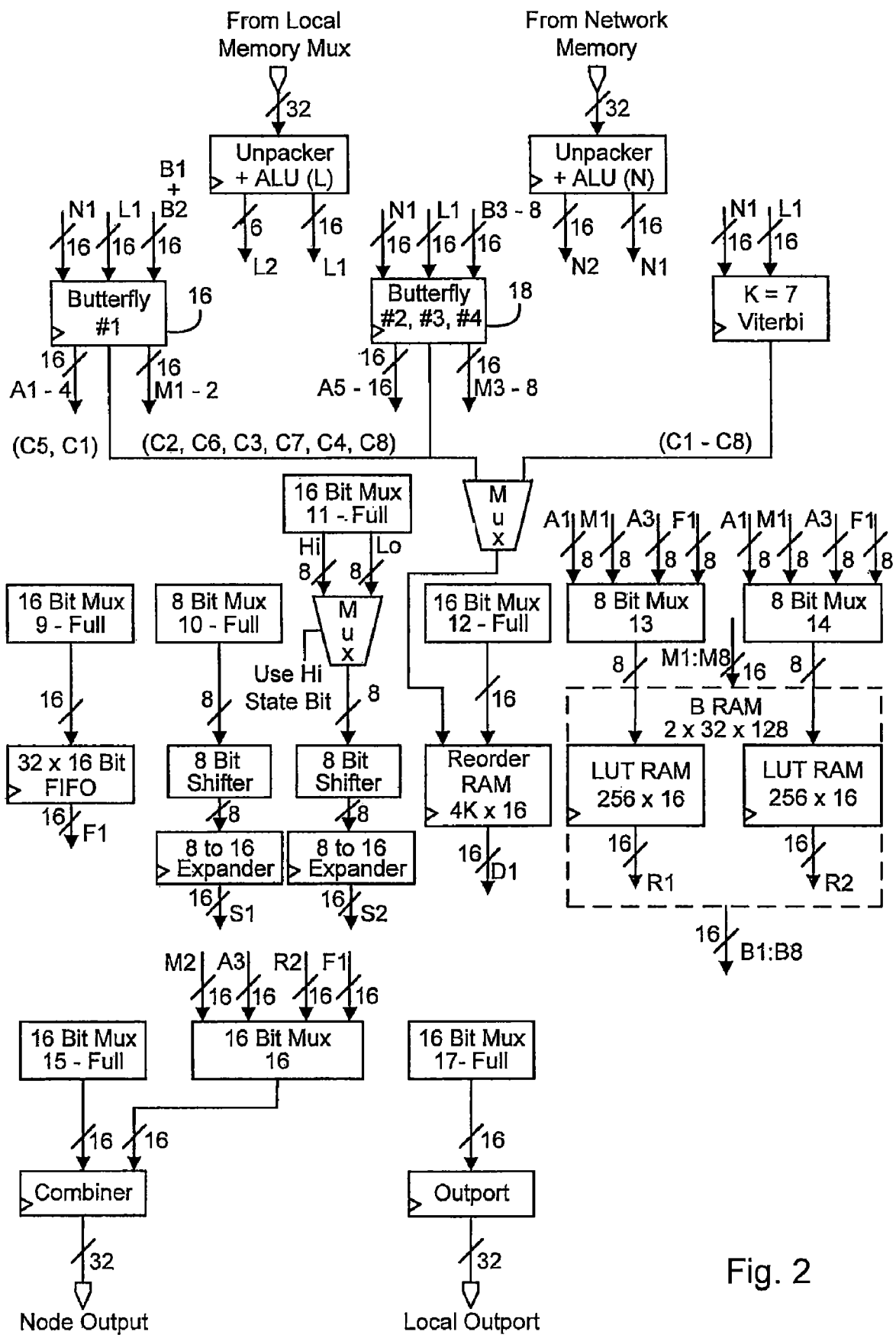
FIG. 2 is a simplified block diagram illustrating an exemplary embodiment of an execution unit in accordance with the present invention.

FIG. 2 is a simplified block diagram illustrating an exemplary embodiment of the EU 12 in accordance with the present invention. The data path for the EU 12 includes data path or functional elements, interconnection elements and storage elements. The data path is 16-bit wide and the data path elements operate on 16-bit or 8-bit data. Where 8-bit data is used, the data is chosen as the lowest bytes of a 16-bit word. Wherever possible, the data path elements are designed to achieve multiple bit operations per clock cycle. For example, rather than using 16 single-bit XORs, a 16-bit XOR is implemented.

The interconnect within the EU 12 is implemented using multiplexers. In one exemplary implementation, there are four types of multiplexers: (1) 8-bit four-to-one (4:1) multiplexers; (2) 16-bit four-to-one multiplexers; (3) 16-bit 16-to-one (16:1) full multiplexers which are fixed during processing of an entire task; and (4) 16-bit 16-to-one (16:1) full multiplexers that can change with each clock cycle. The four-to-one multiplexers are used for functions that typically get their inputs from the same source(s). The full multiplexers allow any of the primary data path element outputs to be used as an input.

In one exemplary embodiment, the storage elements in the EU 12 include the reorder RAM 22 and the LUT RAM 20. The LUT RAM 20 is usually used for accessing table-type data that is typically fixed for an entire task. The reorder RAM 22 is for data that is input to the RBN 10 or created by the RBN 10 during the task. The data in the reorder RAM 22 is usually either used later by the RBN 10 or output by the RBN 10 during the current task. Each of the data path elements or operators 24 in the EU 12 will be further described below.

Data Path Elements/Operators

Unpacker

Figure 3:
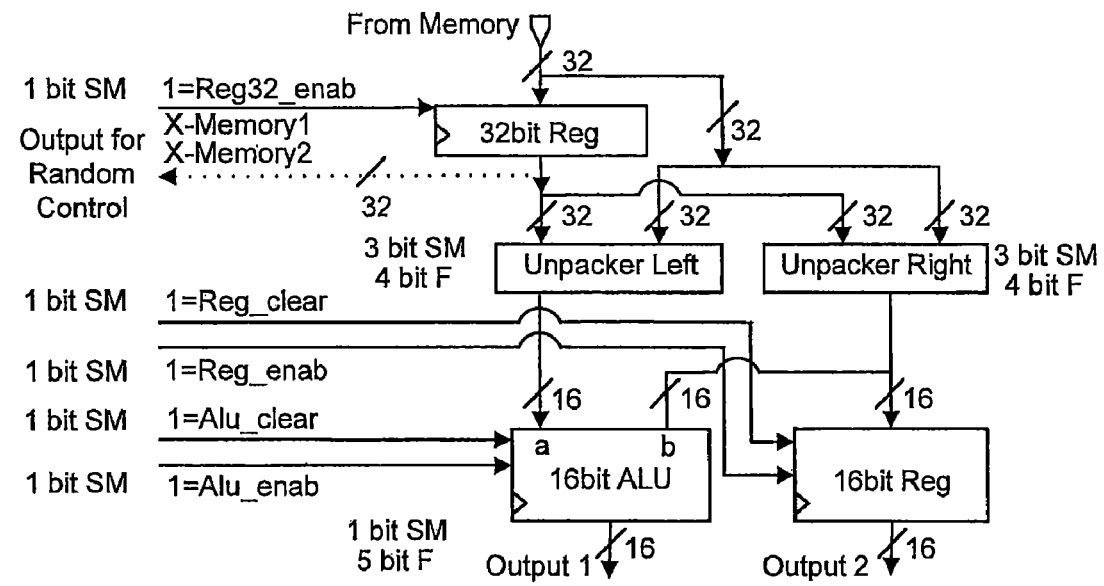
FIG. 3 is a simplified block diagram illustrating an exemplary embodiment of an unpacker in accordance with the present invention.
Figure 3:
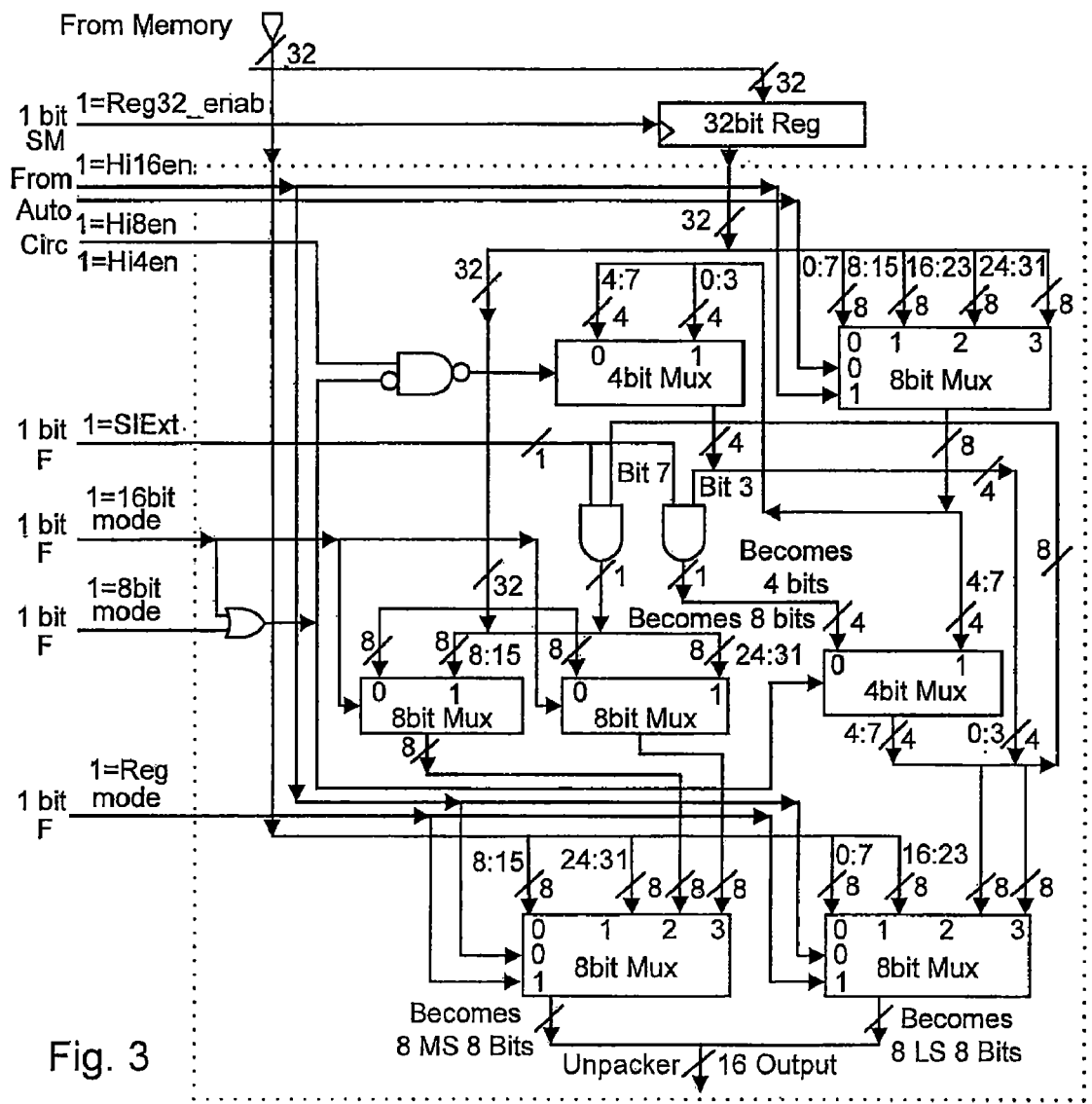

The unpacker provides the ability to unpack 32-bit words into 16-bit, 8-bit or 4-bit words. The data path operates on 16-bit and 8-bit words and the unpacker allows the memory to be used efficiently. The unpacker includes an ALU, which is used in Viterbi for the branch metric calculation, as well as for some other calculations, on the inputs in the programmable mode. The unpacker provides for some basic depuncturing, registering, and sign extension as well. An exemplary embodiment of the unpacker is shown in FIG. 3.

Register File

Figure 4:
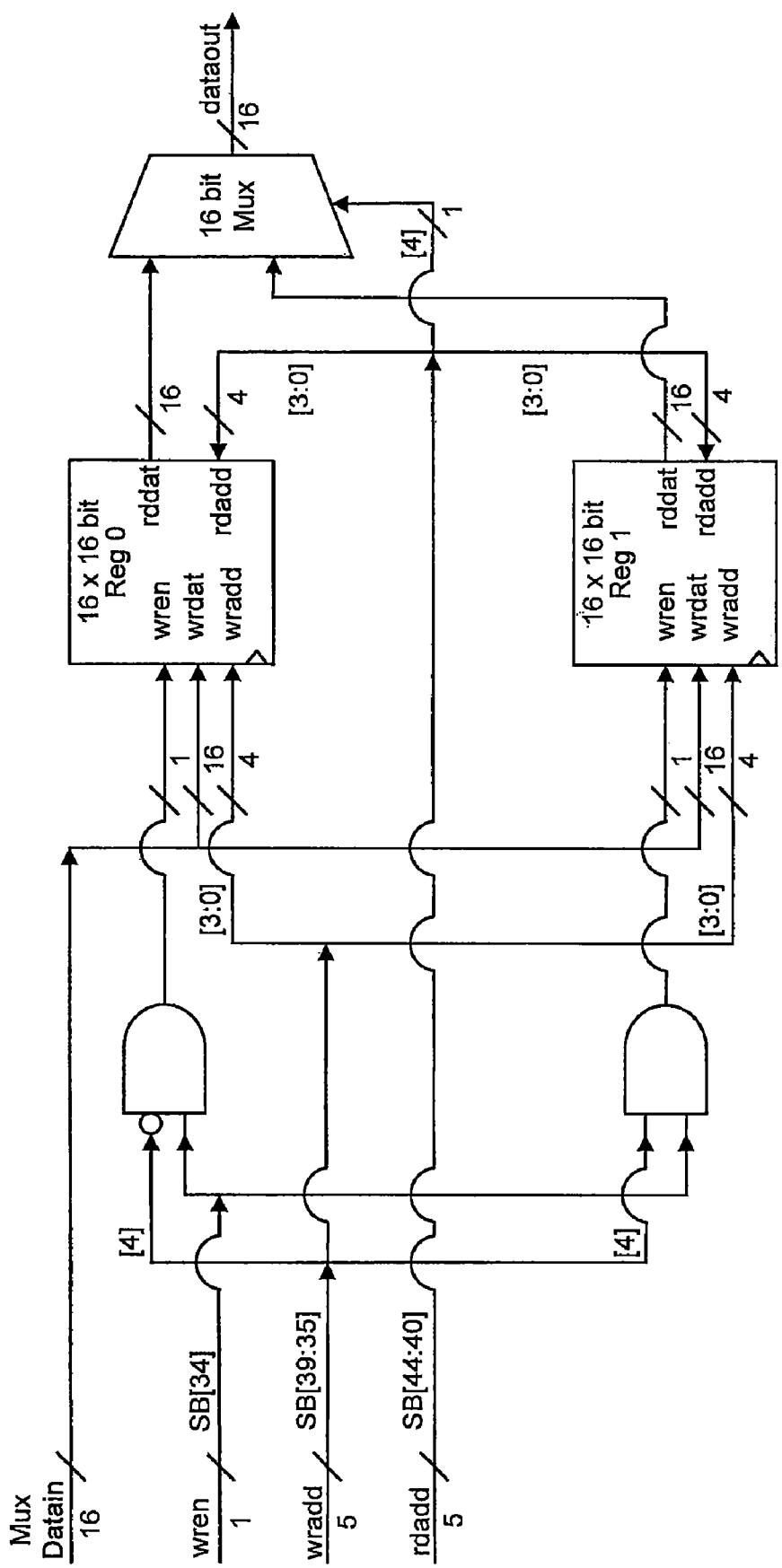
FIG. 4 is a simplified block diagram illustrating an exemplary embodiment of a register file in accordance with the present invention.

The register file is thirty-two words deep and sixteen bits wide (32×16). The register file is used to provide storage of intermediate data which will be needed at a later time. The register file can be used as a FIFO (First-In-First-Out). When used as a FIFO, the register file provides the ability to equalize pipeline delays in the RBN data path. In most applications, when used as a FIFO, the register file is given a fixed delay in number of clock cycles, and any data words written into it will be read out based on a selected number of clock cycles later. In Viterbi mode, the register file has additional features as part of a trace back circuitry. An exemplary embodiment of the register file is shown in FIG. 4.

Shifter

The shifter XORs up to eight (8) shifted versions of an 8-bit input word in a single cycle. The shifter is used to implement functions such as LFSRs (Linear Feedback Shift Registers), convolutional encoders, scramblers and Galois multiplication. An exemplary embodiment of the shifter will be further described below.

The shifter data path input is an 8-bit word. The control is a 15-bit control word. The shifter output is an unregistered 8-bit word which in turn is an input to an expander. The expander combines the 8-bit shifter outputs into 16-bit words. The expander also provides masking and XOR accumulation. The output from the expander is a registered 16-bit word.

Combiner

Figure 5:
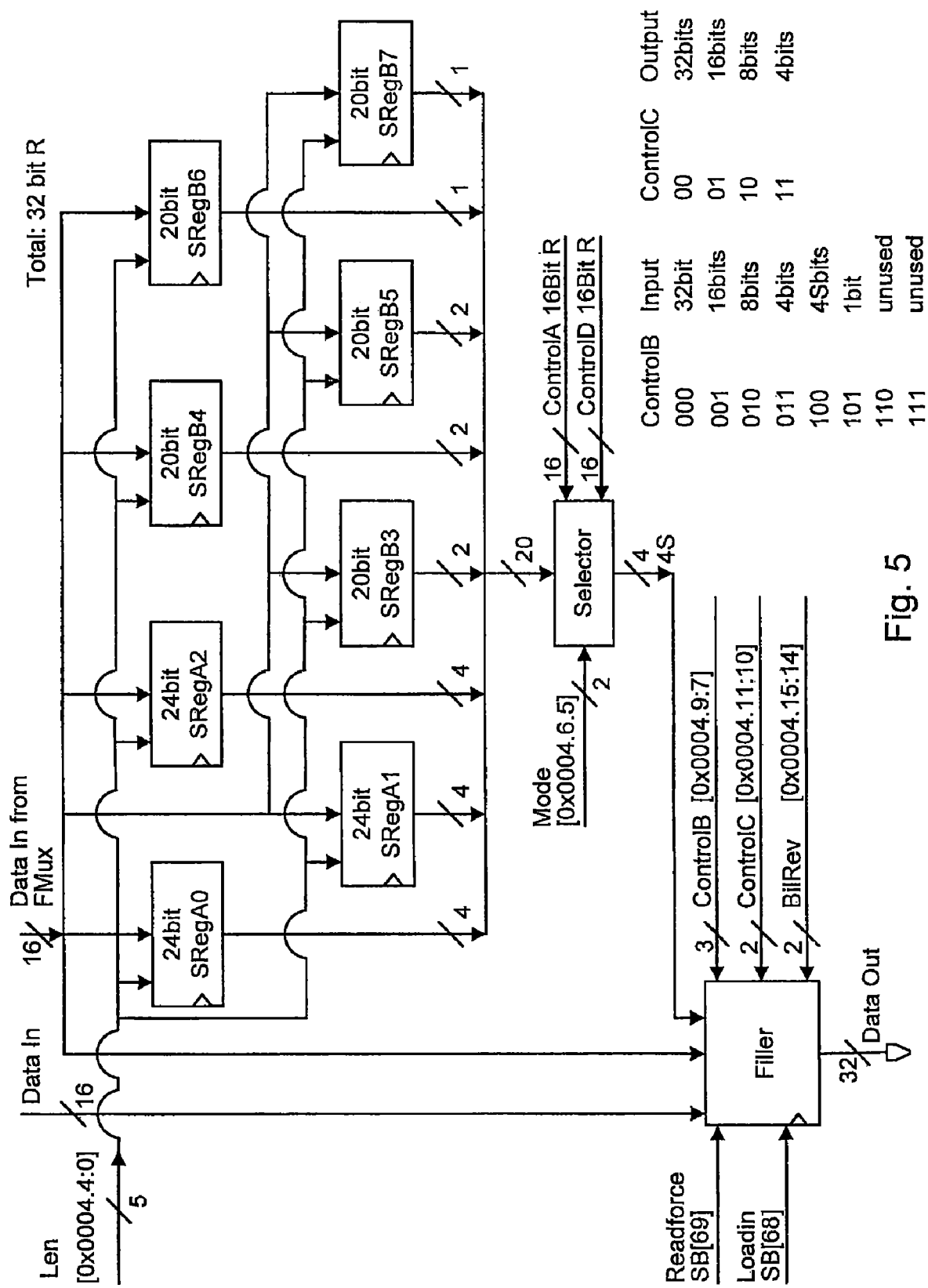
FIG. 5 is a simplified block diagram illustrating an exemplary embodiment of a combiner in accordance with the present invention.

The combiner packs bits, bytes and words into 32-bit words for efficient output to the node wrapper. The combiner accepts one or two 16-bit words. Selections are made which indicate how many bits on the input word or words are to be part of the output. Selections are also made to specify how the input bits will be packed into the output word. The combiner has the capability to perform bit interlacing and bit puncturing. An exemplary embodiment of the combiner is shown in FIG. 5.

Programmable Butterfly Unit #1

Figure 6A:
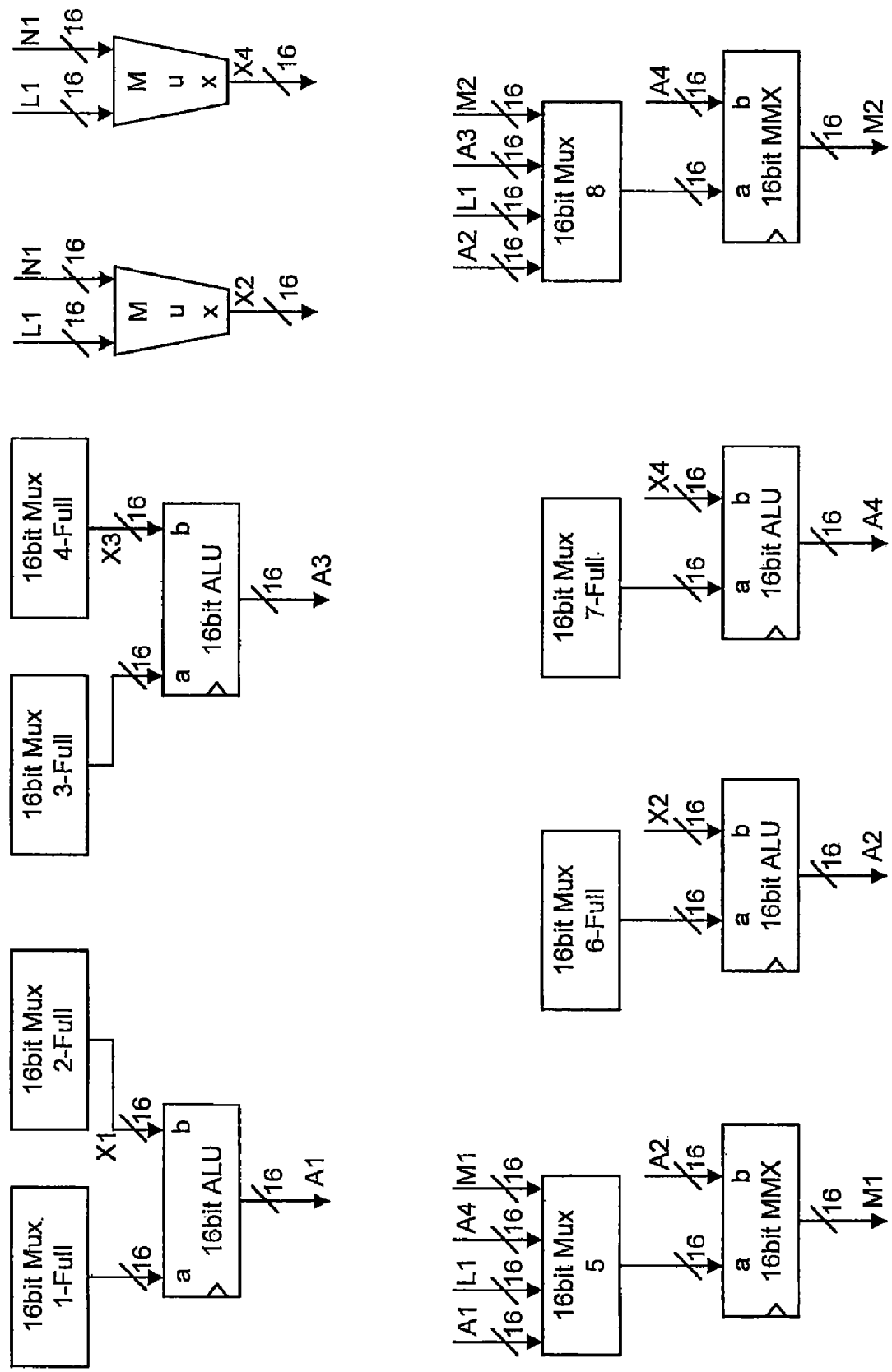
FIG. 6A is a simplified block diagram illustrating a data path of an exemplary embodiment of a programmable butterfly in accordance with the present invention.
Figure 6B:
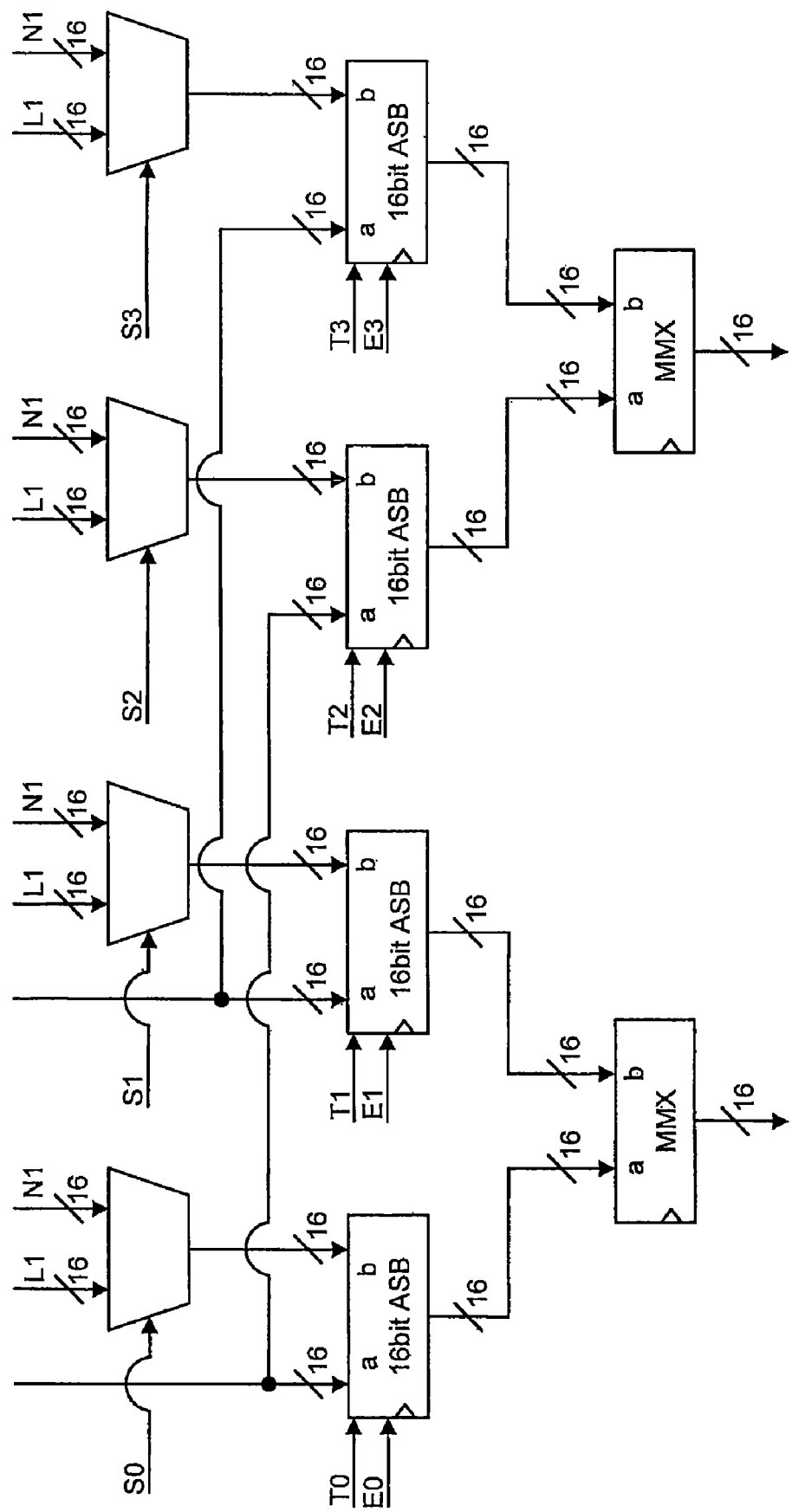
FIG. 6B is a simplified block diagram illustrating an exemplary embodiment of a non-programmable butterfly ii accordance with the present invention.

FIG. 6A is a simplified block diagram illustrating the data path of an exemplary embodiment of the programmable butterfly unit 16 in accordance with the present invention. The programmable butterfly unit 16 is used in the Viterbi Mode. The SISO Mode also makes use of the add-compare-select logic that can be performed by the programmable butterfly unit 16. The butterfly operation implements four adds and two compare select operations. The inputs to the two compare select operations are the outputs of the four adders. The adders also provide subtraction capability. FIG. 6B is a simplified block diagram illustrating an exemplary embodiment of the non-programmable butterfly 18 in accordance with the present invention.

In Viterbi Mode, the inputs to the adders are the branch metrics and path metrics and the selector selects the larger values. In contrast, in SISO Mode, the selector may select the smaller values. In Programmable Mode, the programmable butterfly unit 16 functions are usable for other applications as needed. The programmable butterfly unit 16 further includes a number of elements which will be described below.

ALU

There are several functions in the RBN data path that provide ALU (Arithmetic Logic Unit) type functions. The ALUs have two 16-bit input words A and B. The primary ALUs implement sixteen (16) operations which include A+B, A−B, A OR B, A AND B, and others.

In the ALU, the 16-bit B word can be inverted using a toggle bit that can be changed on a clock cycle basis. The ALU computes a 16-bit output word that is registered.

ADS

The ADS (ADder Subtractor) is an ALU type function. The ADS has two 16-bit input words A and B. While the ALU implements sixteen (16) operations, the ADS implements six (6). The six ADS operations are A+B, A−B, A, B, NOT B and ZERO. Like the ALU, the ADS computes a 16-bit output word which is registered.

MMX

The MMX (Minimum MaXimum) provides the compare and selection operation. The MMX has two 16-bit input words A and B. The MMX implements one of four possible operations. The four operations are MAX(A,B), MIN(A,B), A, and B. The MAX function compares A and B and then outputs the larger of the two values. The MIN function compares A and B and then outputs the smaller of the two values. The A function outputs A. The B function outputs B. The A and B functions are useful for the cases where passing one of the inputs to the output is preferable. The MMX computes a 16-bit output word which is registered.

LUT RAM

The LUT RAM 20 has three primary uses. In Viterbi Mode, the LUT RAM 20 contains the path metric data. In Programmable Mode, the LUT RAM is actually two 256 word by 16-bit RAMs. In Programmable Mode, the LUT RAM 20 is used as either part of the control path or part of the data path. As part of the data path, the LUT RAM 20 is used as a LUT (Look Up Table). When used in this manner, the LUT RAM 20 outputs a 16-bit word which is addressed by the 8-bit input. The LUT RAM 20 is used as a LUT in the SISO, VL Encoding and VL Decoding modes. As part of the control path, the LUT RAM 20 can be used to output 16-bit control words for other functions. For example, when the reorder RAM 22 is used for bit or word interleaving, the address can be sourced from the LUT RAM 20.

Reorder RAM

The reorder RAM 22 is 4K words by 16-bits. In Viterbi Mode, the reorder RAM 22 is used to store the trace back data. In Programmable Mode, the reorder RAM 22 is written sixteen (16) bits at a time. The reorder RAM 22 can be read either as 16-bit words, 8-bit words or a single bit at a time. The reorder RAM 22 has the capability to combine single bits into 8-bit or 16-bit words and combine bytes into 16-bit words. If the single bits or bytes are not combined into words, the accessed bit or byte will be found in the least significant byte or bit in the output word. Some applications use the reorder RAM 22 for storing intermediate data or temporary variables.

Both the read and write addresses for the reorder RAM 22 can be sourced from either the LUT RAM 20 from control counters or from some small patterns in the control path. If a word interleaver were being implemented using the reorder RAM 22, words would typically be written in order into the reorder RAM 22 using a control counter as the write address. If the number of words is small (for example, 8 or fewer), then the small pattern can be used for the read address. If the number of words is moderate (for example, 9 to 256), then the LUT RAM 20 can be used to source the read address. For larger interleavers, the node memory is used to source the read address. The same applies to byte and bit interleaving.

Mode Description

The Programmable Mode has access to all of the RBN functions with exception of the butterfly units #2-4 18. The Programmable Mode uses the EU control unit 14 to set and toggle control bits to the data path functions and data path connections. The Programmable Mode can be set up to provide a wide range of bit-oriented operations.

The Viterbi Mode employs all of the RBN functions but only uses a small part of the programmable "other" functions. The Viterbi Mode uses the LUT RAM 20 as a path metric RAM and uses the reorder RAM 22 as a trace back RAM. In the Viterbi mode, the RBN 10 computes four butterfly operations per clock cycle. The Viterbi Mode involves some specialized control functionality that is not available to the other modes.

Figure 7B:
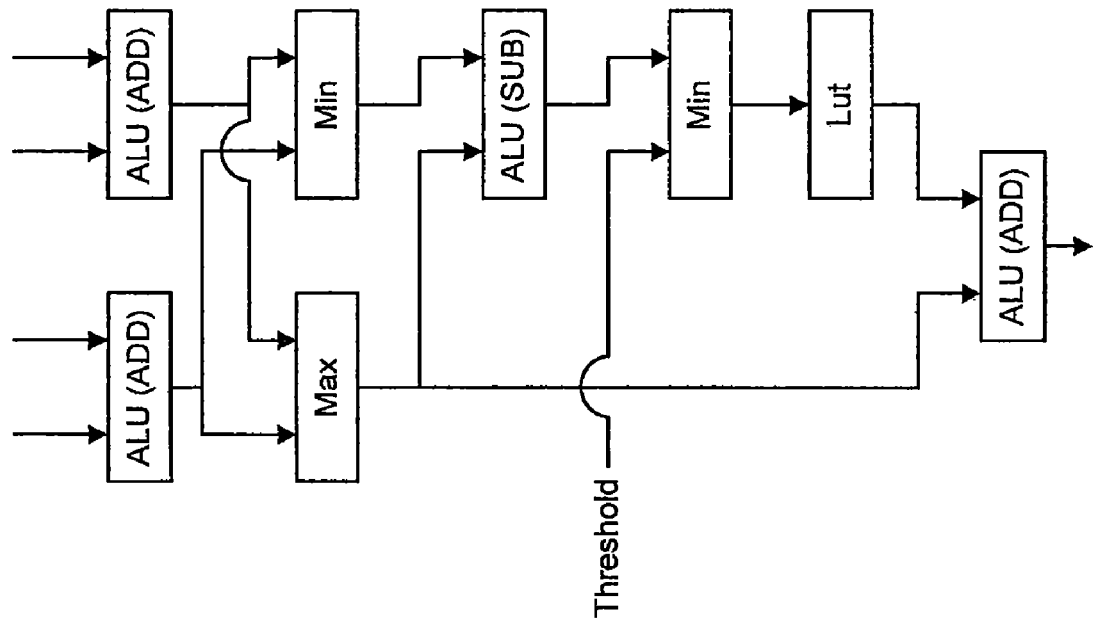
FIG. 7B is a simplified block diagram illustrating a MAX STAR-STAR operation.
Figure 7A:
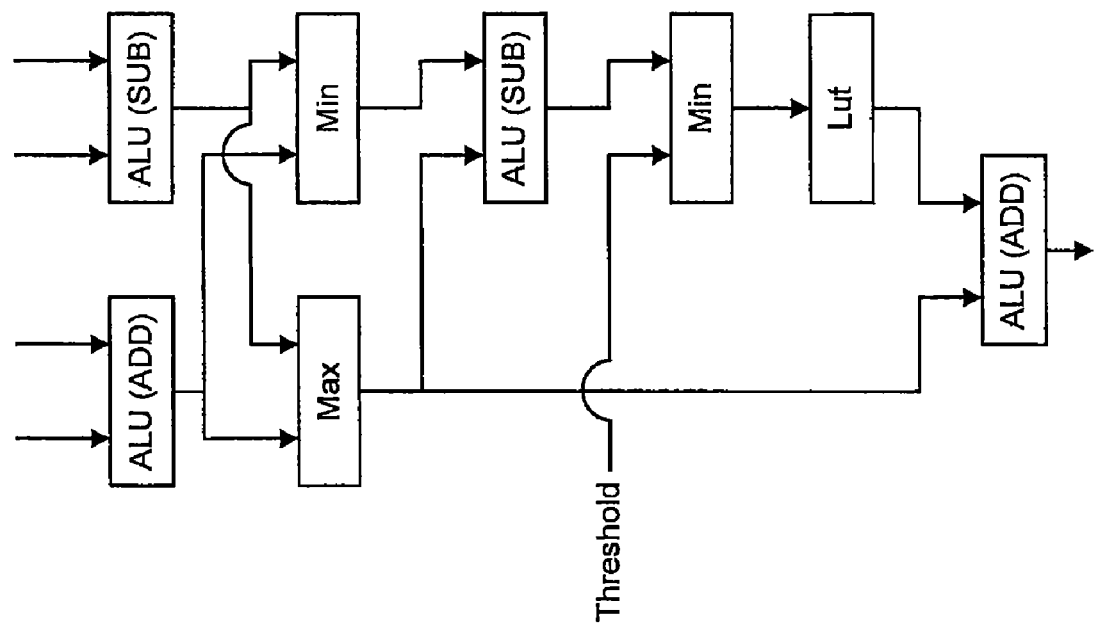
FIG. 7A is a simplified block diagram illustrating a MAX STAR operation.

The SISO Mode is part of a turbo decoder. The SISO Mode involves an operation call MAX STAR. FIG. 7A is an illustrative diagram showing the MAX STAR operation. The MAX STAR operation involves two add compare select computations along with a LUT access and an addition. Optionally, the SISO Mode also involves an operation called MAX STAR-STAR. FIG. 7B is an illustrative diagram showing the MAX STAR-STAR operation. The SISO Mode employs all of the RBN functions. The SISO Mode also involves some specialized control functionality that is not available to the other modes. In the SISO Mode, the RBN 10 computes two MAX STAR operations per clock cycle.

The last two modes are the VL Encoding Mode and VL Decoding Mode. These modes use a small portion of the butterfly operations but use the rest of the RBN functions with the exception of the shifters. Like the Viterbi and SISO Modes, these modes include specialized control functionality that is not available to the other modes.

Figure 8A:
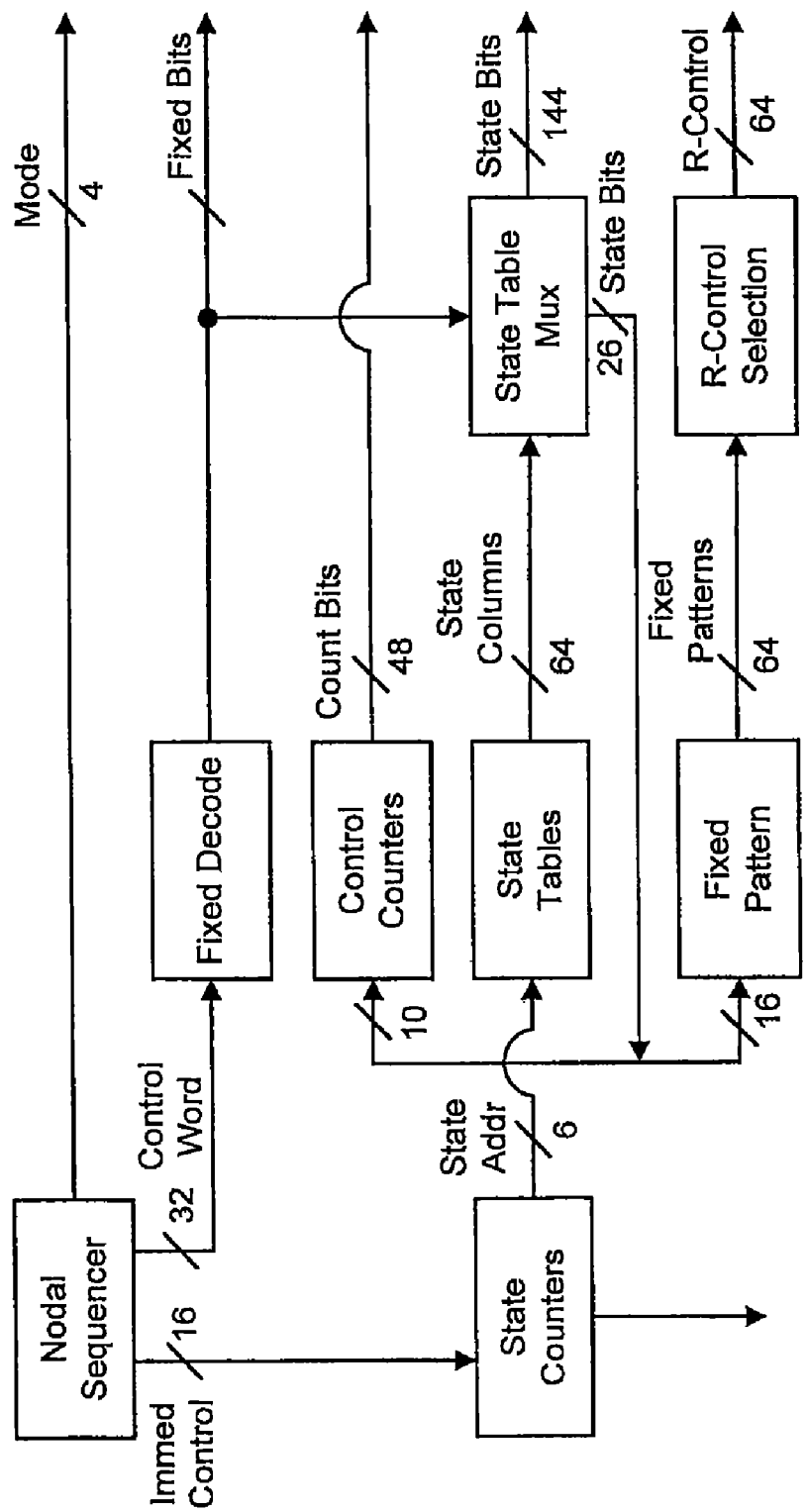
FIG. 8A is a simplified block diagram illustrating an exemplary embodiment of a control unit in accordance with the present invention.
Figure 8B:
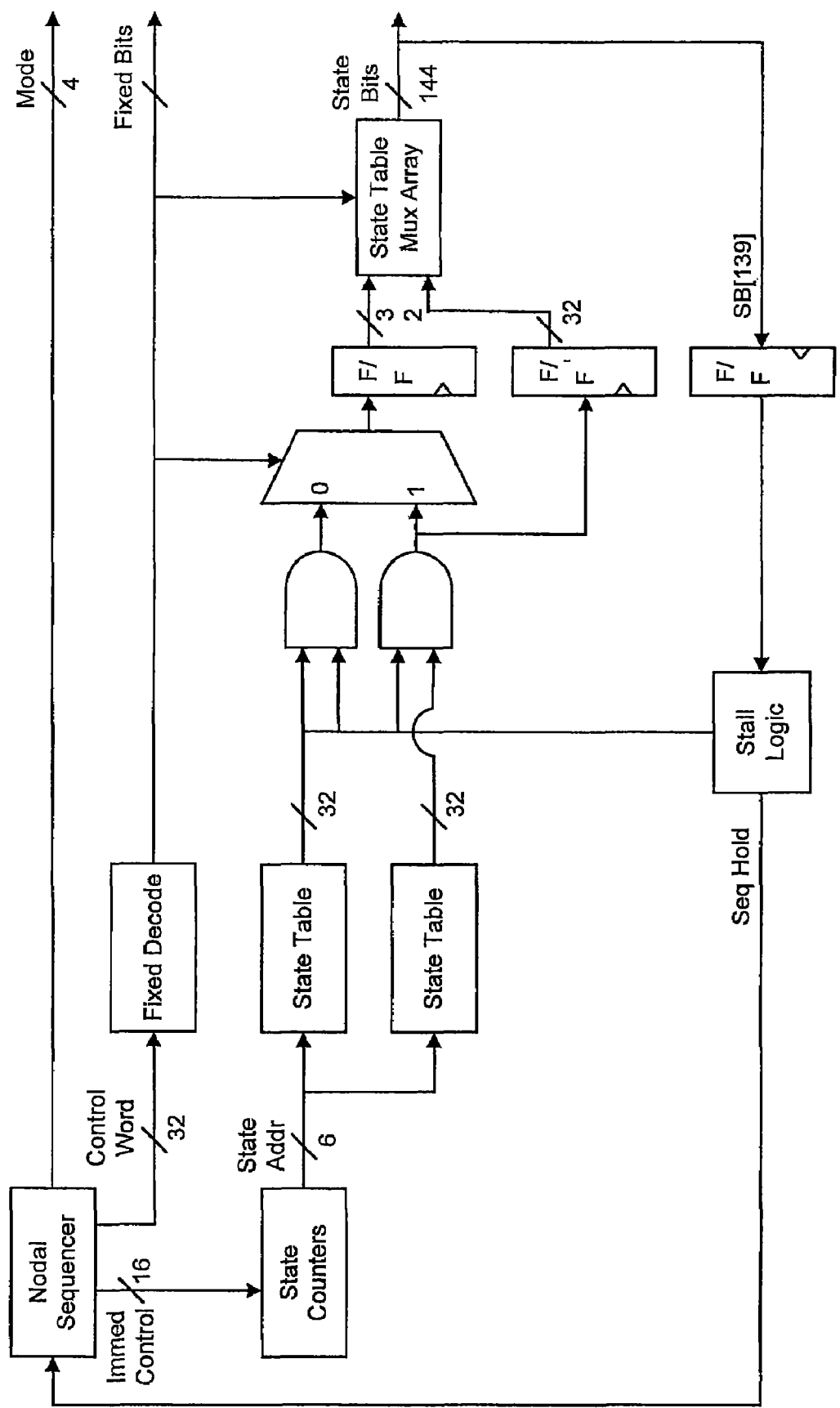
FIG. 8B is a simplified block diagram illustrating control of state bits according to one exemplary embodiment of the present invention.

The EU control unit 14 is used to control the operations of the EU 12. FIG. 8A is a simplified block diagram illustrating an exemplary embodiment of the EU control unit 14 in accordance with the present invention. The primary operation of the RBN 10 is to step through overlapping events. The definition of an "event" is a configuration. Configurations range from setting a mode of a single data path operator to grouping several data path operators together to perform a single operation. The EU control unit 14 sets up a timed sequence of a series of overlapping and potentially repeating events. FIG. 8B is a simplified block diagram illustrating an alternative exemplary embodiment of the EU control unit 14 in accordance with the present invention.

The control bits and state bits define the events, their times of occurrence (i.e. setup time and teardown time of each given event) and pattern (e.g., every clock two cycles) within a task.

A nodal sequencer is a simple instruction based processor. The nodal sequencer executes code from an instruction memory. The nodal sequencer is responsible for all task switching and TPL (Task Parameters List) processing. Along with intertask communications, task setup and tear down, the nodal sequencer provides, if necessary, data dependent branching functions. The nodal sequencer is external to the data path but has read and write capability for all data path registers.

Figure 9:
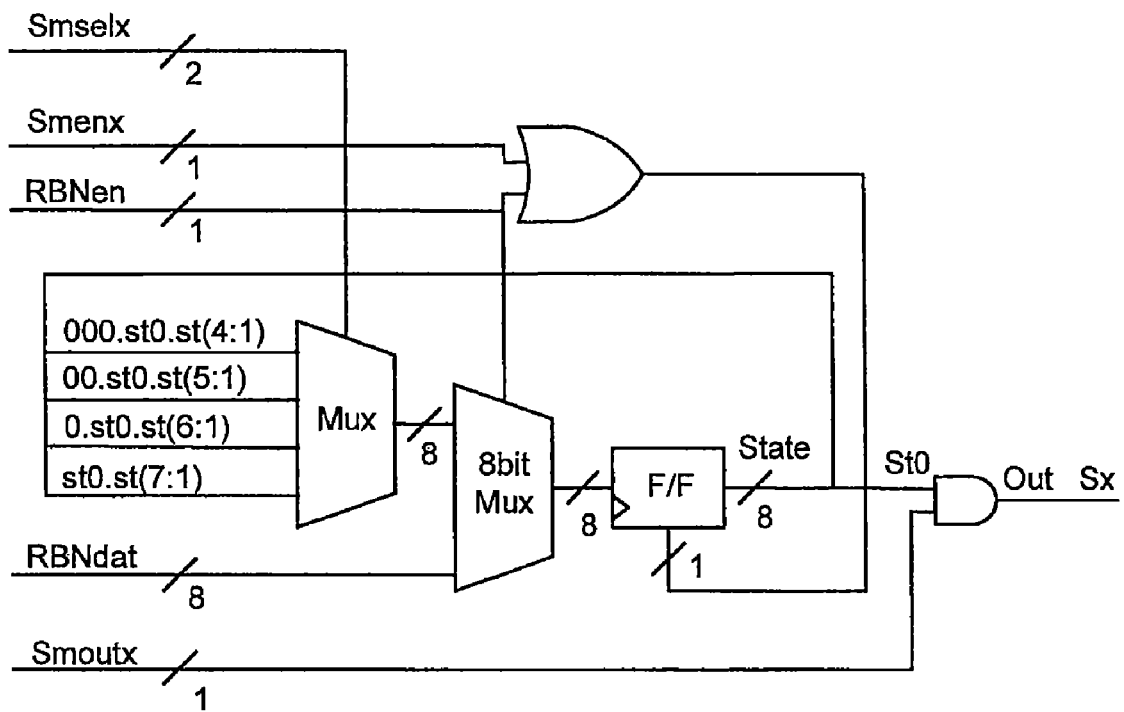
FIG. 9 is a simplified block diagram of an exemplary embodiment of a programmable pattern generator in accordance with the present invention.

Alternatively, programmable pattern generators are capable of creating one-bit patterns with a variety of duty cycles. The pattern generators step through whatever pattern the nodal sequencer provides to the flip-flops during configuration. FIG. 9 is a simplified block diagram of an exemplary embodiment of a programmable pattern generator in accordance with the present invention.

There are three main types of control bits: fixed, counter and state control bits. Although the RBN 10 does change dynamically during operation, many configurations are static, i.e., they do not need to change during a task. Control of the static configuration of a task is implemented as fixed bits. Fixed bits are set before a task and control configurations like multiplexer selections (i.e. interconnects) and ALU modes (e.g. sign-extension, arithmetic/logic operation). The fixed bits are set by the nodal sequencer. The settings for the fixed bits may come from either stored microcode data or from a TPL.

A second type of control for the RBN 10 is provided by counters. Counters are used primarily for addressing the RAMs. The counters implement a variety of addressing modes but can be powerful when combined with the RBN state bits.

Figure 10A:
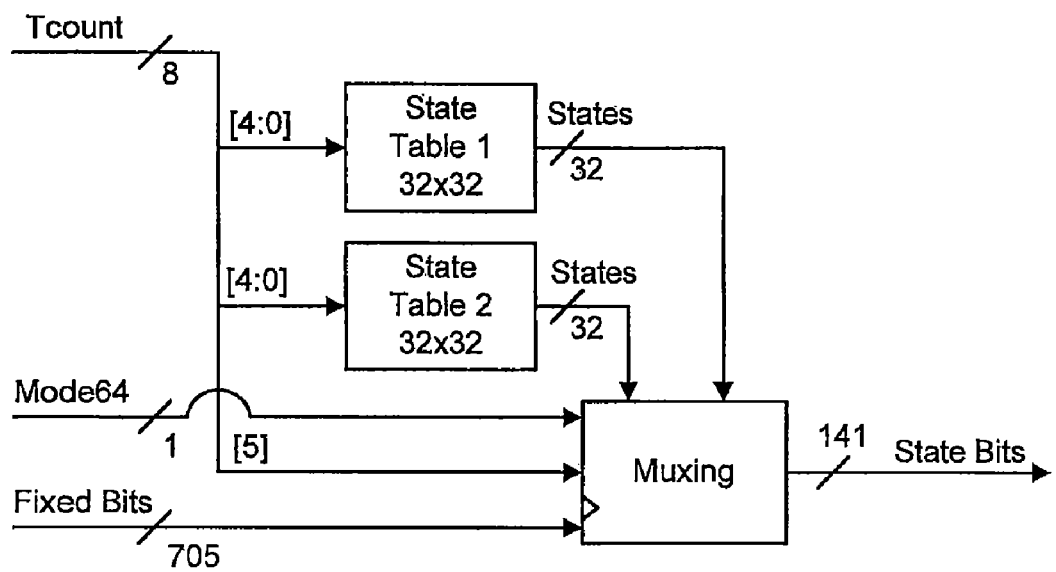
FIG. 10A is a simplified block diagram illustrating how state table(s) is accessed according to one exemplary embodiment of the present invention.
Figure 10B:
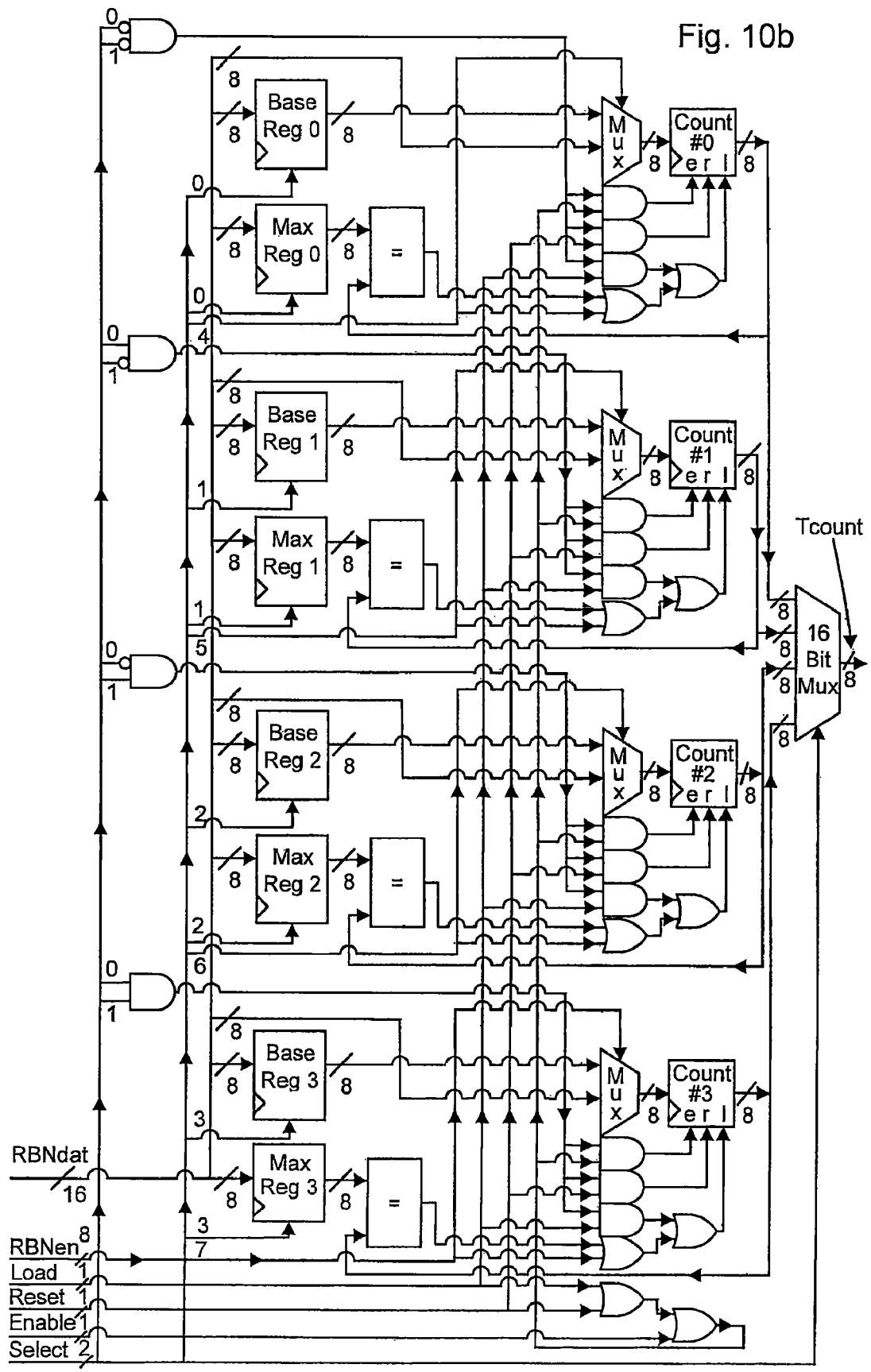
FIG. 10B is a simplified block diagram illustrating how state bit table counters are used to access state table(s) according to one exemplary embodiment of the present invention.

State bits provide dynamic control of the data path. The state bits are generated from the state table(s). FIG. 10A illustrates how state bits are generated. The state table(s) is accessed by the state counters. FIG. 10B illustrates how the state table(s) is accessed by the state counters. The state table output is multiplexed using the fixed state mapping to form the state bits. The state bits are capable of changing on any clock cycle and generating any desired pattern. This is accomplished by state counters which sequence through the predefined state table. There are four (4) state counters in this implementation which allows a maximum loop depth of four (4). This means that one loop can nest inside a second loop etc. The nesting and looping capability of the state counters allows great flexibility and programmability of the state bit patterns.

State bits also control the dynamic configurations of the RBN 10. They are the most complicated of the RBN control options since they are capable of changing on any, or every, clock cycle. State bits control parts of the EU 12 which are variable during the execution of one task, like register enables and multiplexer selections. Some state bits toggle only a few times for a task but are critical in the sequencing. Other state bits toggle as much as every clock cycle. Several mechanisms in the EU control unit 14 are dedicated to ensure the correct toggling of the state bits. State bits can be sourced from events, programmable pattern generators, counter TCs (Terminal Counts), or counter bits. During configuration, the nodal sequencer sets which source feeds each state bit.

During task execution, the nodal sequencer sets triggers at specific and usually pre-specified times. When a trigger occurs, a specific event bit (or event bits) is toggled to mark the setup or teardown time of a specific event. Once events are active, they can cause the state bits to toggle, the programmable pattern generators to start or stop, or the counters to count, stop counting or change direction.

Figure 11:
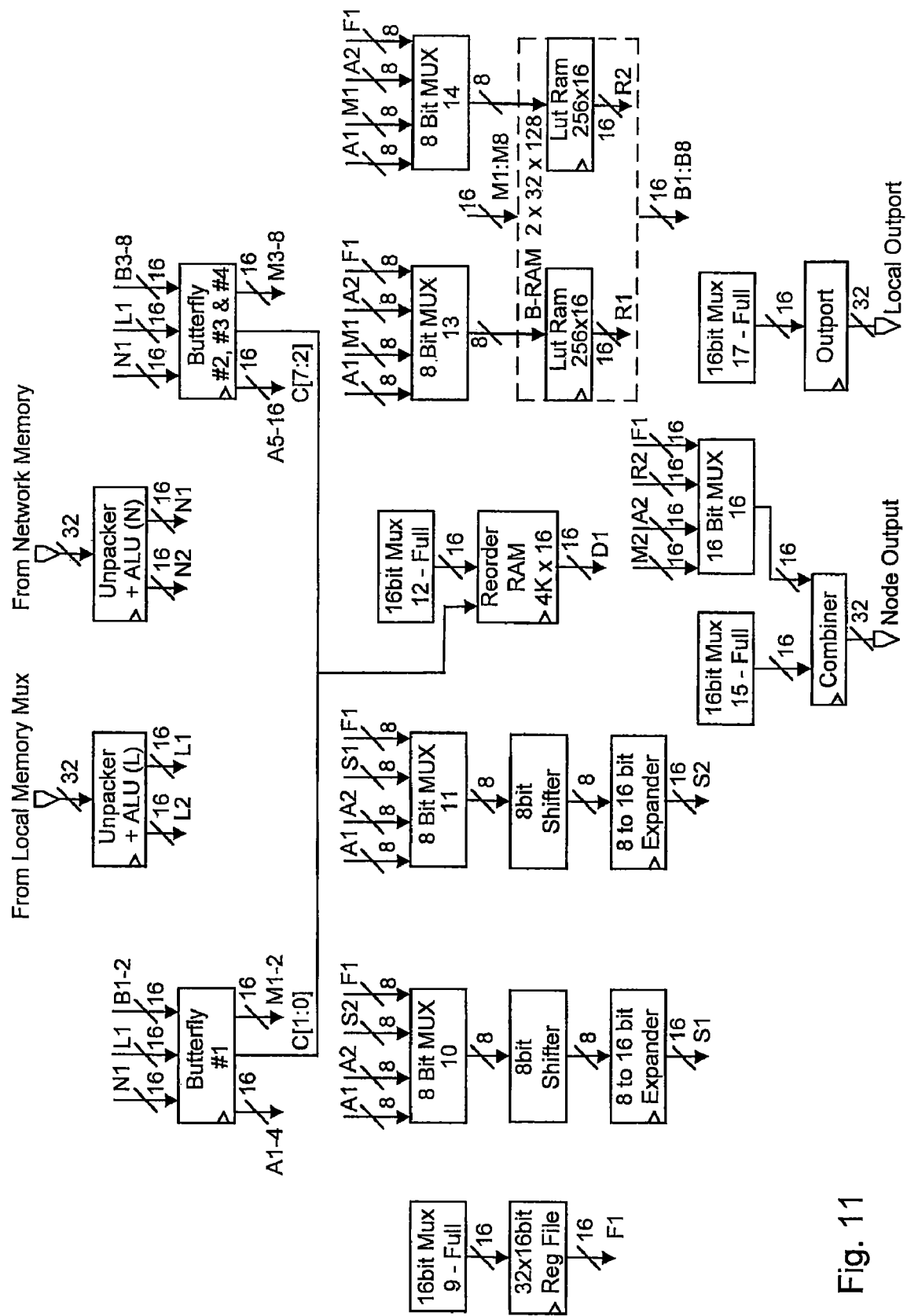
FIG. 11 is a simplified block diagram illustrating a data path of an exemplary embodiment of the control unit in accordance with the present invention.
Figure 12:
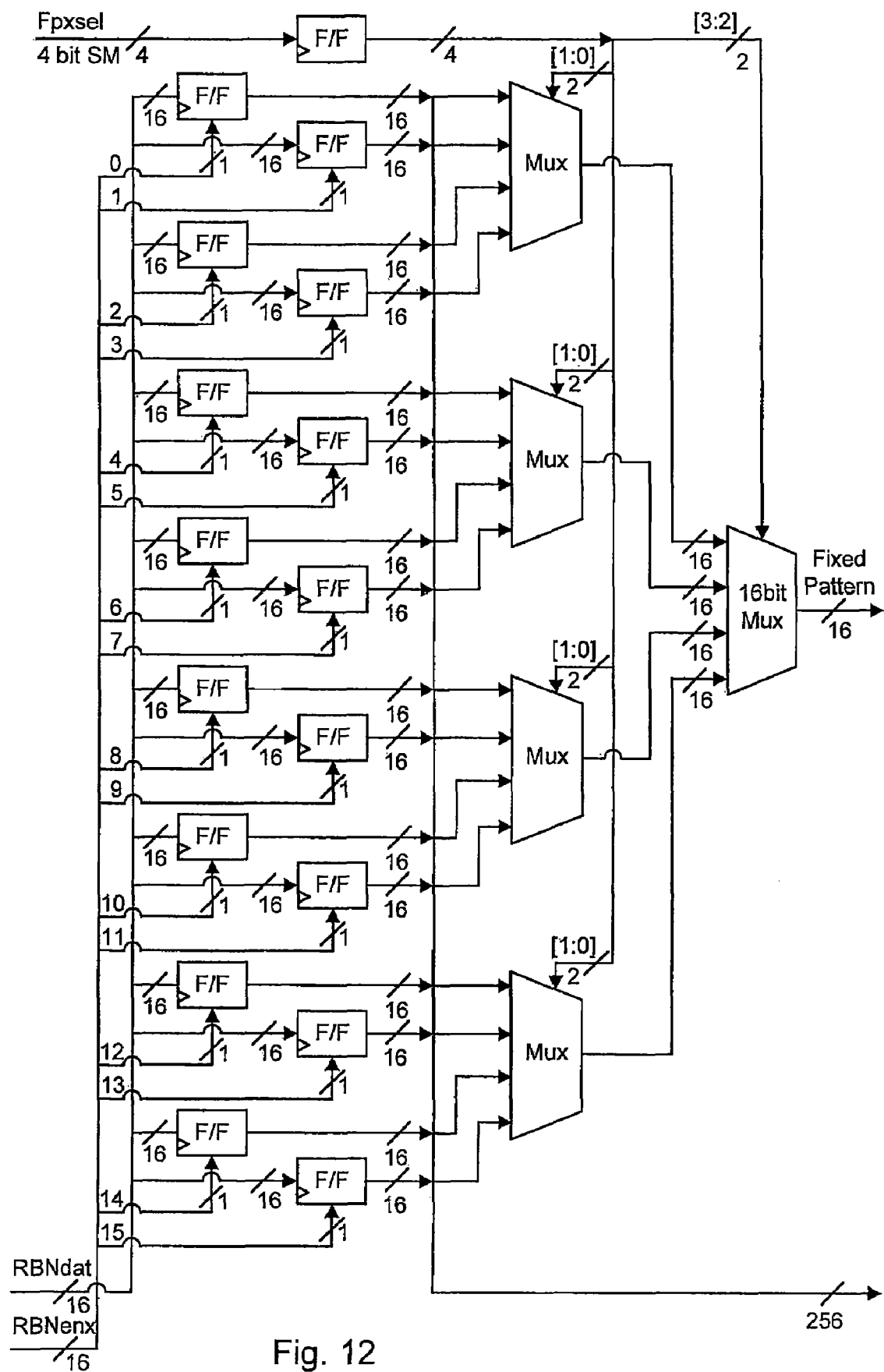
FIG. 12 is a simplified block diagram illustrating how fixed pattern control is provided according to one exemplary embodiment of the present invention.

FIG. 11 is a simplified block diagram illustrating a data path of an exemplary embodiment of the EU control unit 14 in accordance with the present invention. In addition to the fixed and state bits, there are some addresses and some word length controls needed by the EU 12. The word length control is called R-Control. Referring to FIG. 11, the R-Control destinations include: shifter1, shifter2, reorder RAM read, reorder RAM write, combiner Control A and combiner Control D. Also shown are the R-Control sources. The LUT RAM 20 performs double duty since it is sometimes part of the data path and sometimes part of the R-Control. The LUT RAM 20 is addressed by 8-bit counters when used as part of the R-control. The X-memory source is part of the nodal memory. When the X-memory is used as a source, the L1 and L2 sources are not available to the data path. The fixed pattern sources are sometimes called the small patterns and are simply sixteen 16-bit control words. FIG. 12 illustrates how the fixed pattern is generated. The nodal sequencer sets the control words during configuration. The smcount1 and smcount2 sources are 16-bit up/down counters which can be used to address the reorder RAM 22 read and/or write ports. The fixed patterns and the counters are controlled by state bits.

As mentioned above, the shifter in the EU 12 is used to implement functions such as LFSRs, convolutional encoders, scramblers and Galois multiplication. Since the RBN 10 is used to handle communication and signal processing, it is capable of managing the channel coding requirements of various wireless standards. Channel coding schemes include error detecting cyclic codes, error detecting and correcting Hamming codes, single burst error correcting Fire codes, and so on. Typically, these codes are represented by their generator polynomials. The degree of polynomials used for the various wireless standards spans a wide range, from degree 3 for a GSM CRC, to degree 42 for the CDMA long code, to effective degrees of 64 and 128 for the GSM and Bluetooth ciphers, respectively. Much longer codes exist in W-CDMA. Encoders and decoders for these kinds of codes utilize LFSRs to multiply and divide code polynomials. Because of the large number of different codes used by the various wireless standards, it is impractical, in the RBN 10, to use separate LFSRs for each encoder and decoder. Under the present invention, a programmable computational element is implemented to perform these operations.

LFSRs are combinations of shift register stages and mod-2 adders. Inherently, these are bit-oriented structures. In one exemplary embodiment, the shifter used in the RBN 10 is one (1) byte or eight (8) bits in width. However, it should be understood that the shifter can be implemented with any number of bits. An illustrative example will be presented to demonstrate how the byte-oriented computational element can implement these kinds of bit-oriented structures.

Figure 13:
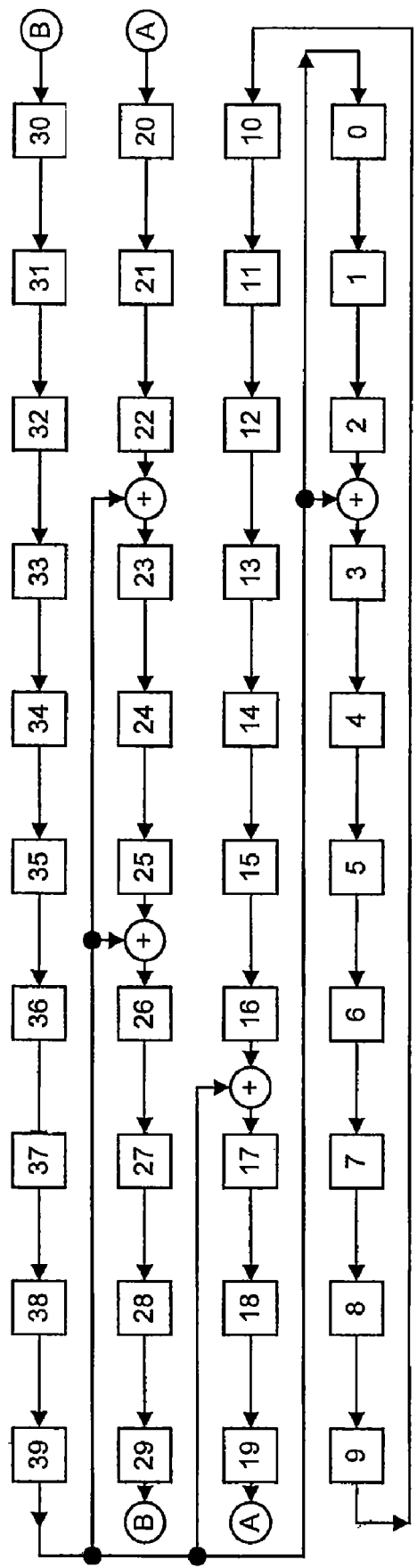
FIG. 13 is a simplified schematic diagram illustrating a linear feedback shift register for the generator polynomial used for the GSM (224, 184) Fire code according to one exemplary embodiment of the present invention.

An LFSR for the generator polynomial used for the GSM (224, 184) Fire code is shown in FIG. 13. Each square with a number is a flip-flop and the modulo-2 adders (exclusive or gates) are the circles with plus signs.

In the GSM (224, 184), a block of 184 information bits is protected by 40 extra parity bits used for error detection and correction. These bits are appended to the 184 bits to form a 224 bit sequence. The encoding of the cyclic code is performed in a systematic form, which means that, in the GSM (224, 184), the polynomial:

$$d(0)x223+d(1)x222+\ldots+d(183)x40+p(0)x39+\ldots+p(38)x+p(39)$$

where $\{d(0),d(1),\ldots,d(183)\}$ are the information bits and $\{p(0),p(1),\ldots,p(39)\}$ are the parity bits, when divided by g(x), the generator polynomial, yields a remainder equal to:

$$1+x+x2+\ldots+x39.$$

Figure 14:
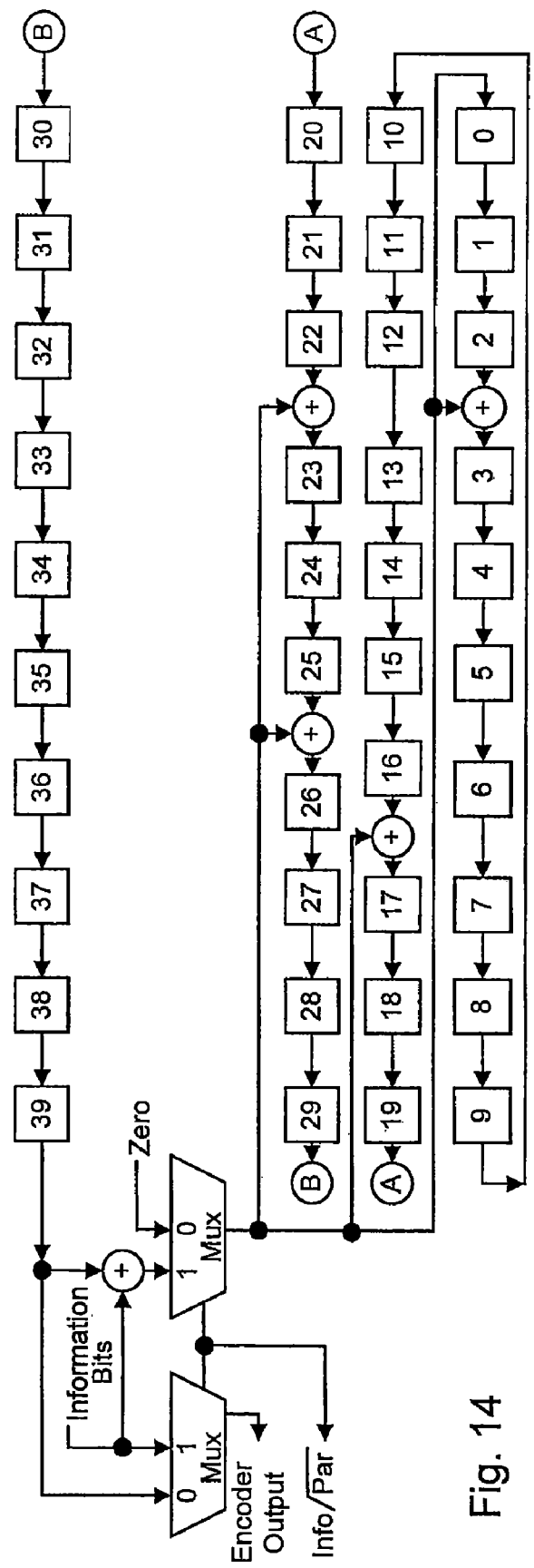
FIG. 14 is a simplified block diagram of an encoder.

The block diagram for the encoder is shown in FIG. 14.

For 184 clock periods, with control signal info/not_par=1, the information bits concurrently are shifted into the LFSR and out of the encoder. Then, for 40 clock periods, with control signal info/not_par=0, the parity bits are shifted out of the LFSR.

The bit-serial implementation is straightforward. With d(k) representing the information bits, and with r(i) representing the 40-bit LFSR:

for k=0 to 183

$r(i):=r39 \oplus d(k)$ for $i=0$;

$r(i):=r(i-1)$ for $i=1, 2, 4\ldots 16, 18\ldots 22, 24, 25, 27\ldots 39$; and $r(i):=r(i-1)\oplus r39\oplus d$ for $i=3, 17, 23$ and $26$ Mapping this encoder onto the byte-oriented LFSR element requires processing eight information bits at one time and computing the LFSR state after eight consecutive shifts.

In the case of an N-bit parallel implementation, it is necessary to process N information bits at one time and compute the LFSR state after N consecutive shifts. With $d(0), d(1), \ldots, d(7)$ representing the information byte, one can see by inspection from FIG. 14 that the feedback byte, $b(0), b(1), \ldots, b(7)$ will be:

$b(k)=d(k)\oplus r(39-k)$ for $k=0$ to 7

In the N case, the input data is $d(0), d(1), \ldots, d(N)$ and the feedback data, $b(0), b(1), \ldots, b(N)$ will be:

$b(k)=d(k)\oplus r(39-k)$ for $k=0$ to N

The new LFSR state can be generated by the bit-wise modulo-2 addition of the lower (39−(N−1)), or 32 bits in this example, of the LFSR and, in accordance with the feedback taps, five copies of the feedback data. The 8-bit version is illustrated in Table 1 below.

TABLE 1

Update Table for LFSR State after Eight Consecutive Shifts

Register Stage 39 38 37 36 35 34 33 32 31 30 29 28 27 26 25 24 23 22 21 20 19 18 17 16 15 14 13 12 11 10 09 08 07 06 05 04 03 02 01 00

Inputs to Bit-wise Modulo-2 Addition Process 31 30 29 28 27 26 25 24 23 22 21 20 19 18 17 16 15 14 13 12 11 10 09 08 07 06 05 04 03 02 01 00
                                                                                   b0 b1 b2 b3 b4 b5 b6 b7
                                                                    b0 b1 b2 b3 b4 b5 b6 b7
                                         b0 b1 b2 b3 b4 b5 b6 b7
                       b0 b1 b2 b3 b4 b5 b6 b7
b0 b1 b2 b3 b4 b5 b6 b7

This table simply indicates the bit-wise modulo-2 additions that must be performed to update the LFSR after eight consecutive shifts. It is read vertically. For example, the new state for register stage 28 will be the modulo-2 addition of feedback bit b2, feedback bit b5 and the current value of register stage 20; the new state for register stage 23 will be the modulo-2 addition of feedback bit b1, feedback bit b7 and the current value of register stage 15; and so on. From the table, it can be seen that if a bit-wise modulo-2 addition occurs with bit r(m) and b0 then bit r(m−1) will be gated with b1 and bit r(m−i) will be gated with b(i) assuming i>N. Vector u is computed as the modulo-2 sum of vector b bits which are needed to update a given segment of the r vector. So:

$r(k):=r(k-N)\oplus u(k-N)$

In this example, $u(20)=b(2)\oplus b(5)$ and $r(28):=r(20)\oplus u(20)$. Restating an earlier point but in terms of u, if bit b0 is part of the computation for u(m) then bit b1 will be part of u(m−1) and bit b(i) will be part of u(m−i) assuming i<N.

In this example it is worth noting that the new states for twelve register stages are simply the current states of the respective register stages with an index offset of eight.

That is, $r(i):=r(i-8)$ for $i=11\ldots16, 34\ldots39$

Figure 15:
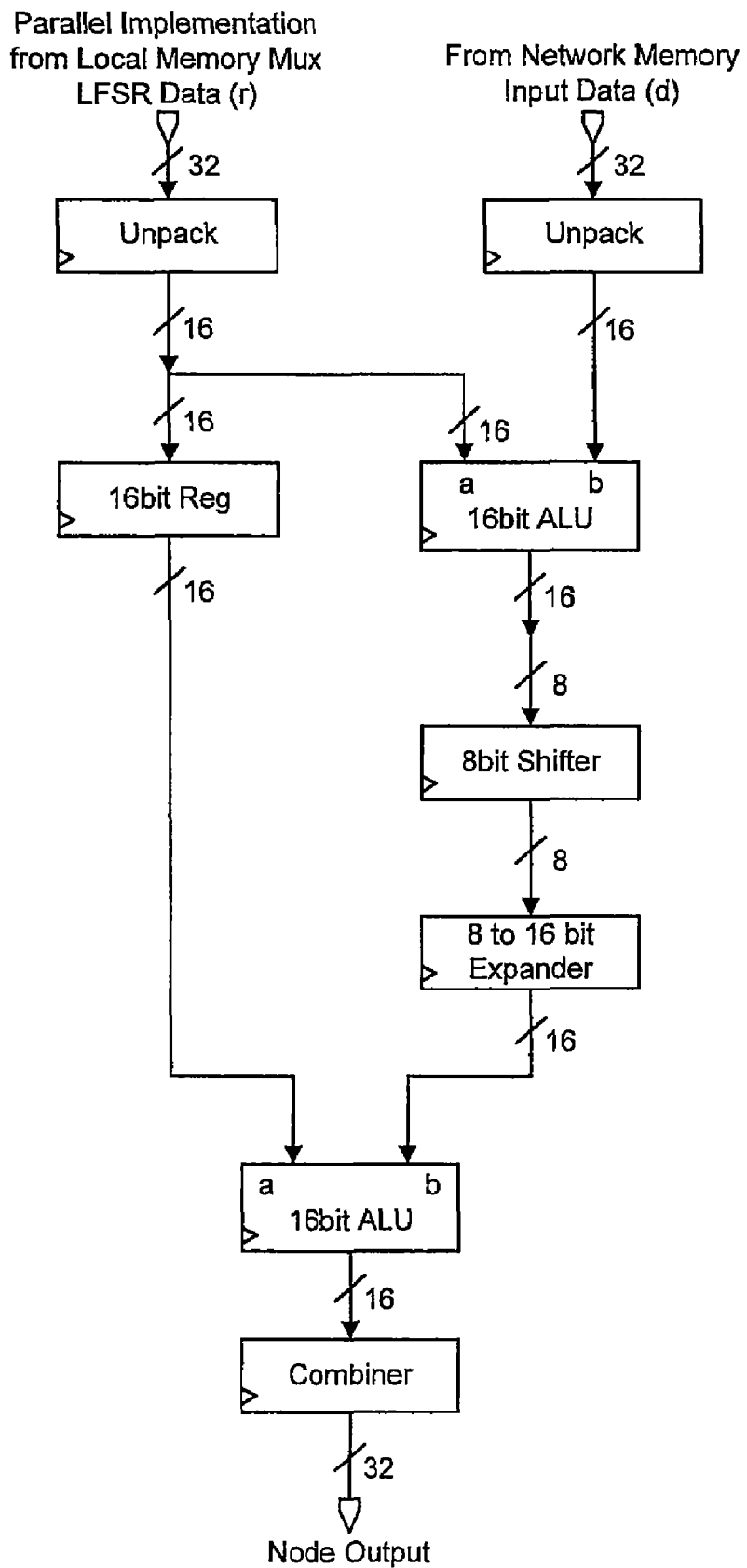
FIG. 15 is a simplified block diagram showing an exemplary parallel hardware implementation of a shifter in accordance with one exemplary embodiment of the present invention.

The byte-oriented implementation, too, is relatively straightforward. FIG. 15 shows the parallel hardware implementation. The 8 bit input data (d) arrives 32 bits at a time from the network memory. Since most of the RBN 10 uses 16 bit data paths, the input data is unpacked into 8 bit words with 8 zeros added as the high bits. This data is then fed to an ALU configured to perform an XOR. The LFSR state is read in from the local memory. It is possible to store the LFSR in a local register file instead of the local memory but that is not shown here. After unpacking, the high byte of the LFSR data (r(39:32) in our case) is fed to the ALU to be XORed with d(7:0). The output of the ALU is the b(7:0) byte with 8 zeros added as the high bits. The b byte is not changed until the entire LFSR has been updated. Each clock, 8 new bits of the LFSR (r) are clocked from the unpacker and into a pipeline register. Also, on each clock, 8 new bits of the update vector (u) are computed by the shifter using the b byte. The expander simply expands the u byte to 16 bits which are then XORed in the second ALU with the r byte to form an updated byte of the LFSR. The combiner forms 32 bit words for storage in the local memory. The 40 bit example shown here runs better out of a register file but if the LFSR bits (r) are transferred to and from local memory as 8 bits plus 24 zeros then the local memory version runs efficiently too.

All the shifter does is changes the b byte into the update byte (u). Every clock cycle, a new set of control bits, c(14:0), arrive to convert b bytes into u bytes. Table 2 shows the output bit and the input used to compute it. It also shows the b bits and then the control bits necessary to compute the update byte u. From Table 2, it can be seen that for the first byte (byte 0) the only control bit set is C13. For the second byte, C14, C8 and C5 are set. For the third byte, C6 and C0 are set. For the fourth byte, C12 is set. For the last byte (byte 4), C7 and C4 are set.

TABLE 2

Update bits for GSM (224, 184)

| Output (new r) | Input (old r) | Update bits (u) | Byte, Bit | Control Bits |
|---|---|---|---|---|
| R(39) | R(31) | — | 0, 0 | C13(−) |
| R(38) | R(30) | — | 0, 1 | C13(−) |
| R(37) | R(29) | — | 0, 2 | C13(−) |
| R(36) | R(28) | — | 0, 3 | C13(−) |
| R(35) | R(27) | — | 0, 4 | C13(−) |
| R(34) | R(26) | — | 0, 5 | C13(−) |
| R(33) | R(25) | B0 | 0, 6 | C13(B0) |
| R(32) | R(24) | B1 | 0, 7 | C13(B1) |
| R(31) | R(23) | B2 | 1, 0 | C5(B2), C8(−), C14(−) |
| R(30) | R(22) | B0, B3 | 1, 1 | C5(B3), C8(B0), C14(−) |
| R(29) | R(21) | B1, B4 | 1, 2 | C5(B4), C8(B1), C14(−) |
| R(28) | R(20) | B2, B5 | 1, 3 | C5(B5), C8(B2), C14(−) |
| R(27) | R(19) | B3, B6 | 1, 4 | C5(B6), C8(B3), C14(−) |
| R(26) | R(18) | B4, B7 | 1, 5 | C5(B7), C8(B4), C14(−) |
| R(25) | R(17) | B5 | 1, 6 | C5(−), C8(B5), C14(−) |
| R(24) | R(16) | B0, B6 | 1, 7 | C5(−), C8(B6), C14(B0) |
| R(23) | R(15) | B1, B7 | 2, 0 | C0(B7), C6(B1) |
| R(22) | R(14) | B2 | 2, 1 | C0(−), C6(B2) |
| R(21) | R(13) | B3 | 2, 2 | C0(−), C6(B3) |
| R(20) | R(12) | B4 | 2, 3 | C0(−), C6(B4) |
| R(19) | R(11) | B5 | 2, 4 | C0(−), C6(B5) |
| R(18) | R(10) | B6 | 2, 5 | C0(−), C6(B6) |
| R(17) | R(9) | B7 | 2, 6 | C0(−), C6(B7) |

TABLE 2-continued

Update bits for GSM (224, 184)

| Output (new r) | Input (old r) | Update bits (u) | Byte, Bit | Control Bits |
|---|---|---|---|---|
| R(16) | R(8) | — | 2, 7 | C0(−), C6(−) |
| R(15) | R(7) | — | 3, 0 | C12(−) |
| R(14) | R(6) | — | 3, 1 | C12(−) |
| R(13) | R(5) | — | 3, 2 | C12(−) |
| R(12) | R(4) | — | 3, 3 | C12(−) |
| R(11) | R(3) | — | 3, 4 | C12(−) |
| R(10) | R(2) | B0 | 3, 5 | C12(B0) |
| R(9) | R(1) | B1 | 3, 6 | C12(B1) |
| R(8) | R(0) | B2 | 3, 7 | C12(B2) |
| R(7) | — | B0, B3 | 4, 0 | C4(B3), C7(B0) |
| R(6) | — | B1, B4 | 4, 1 | C4(B4), C7(B1) |
| R(5) | — | B2, B5 | 4, 2 | C4(B5), C7(B2) |
| R(4) | — | B3, B6 | 4, 3 | C4(B6), C7(B3) |
| R(3) | — | B4, B7 | 4, 4 | C4(B7), C7(B4) |
| R(2) | — | B5 | 4, 5 | C4(−), C7(B5) |
| R(1) | — | B6 | 4, 6 | C4(−), C7(B6) |
| R(0) | — | B7 | 4, 7 | C4(−), C7(B7) |

Figure 16:
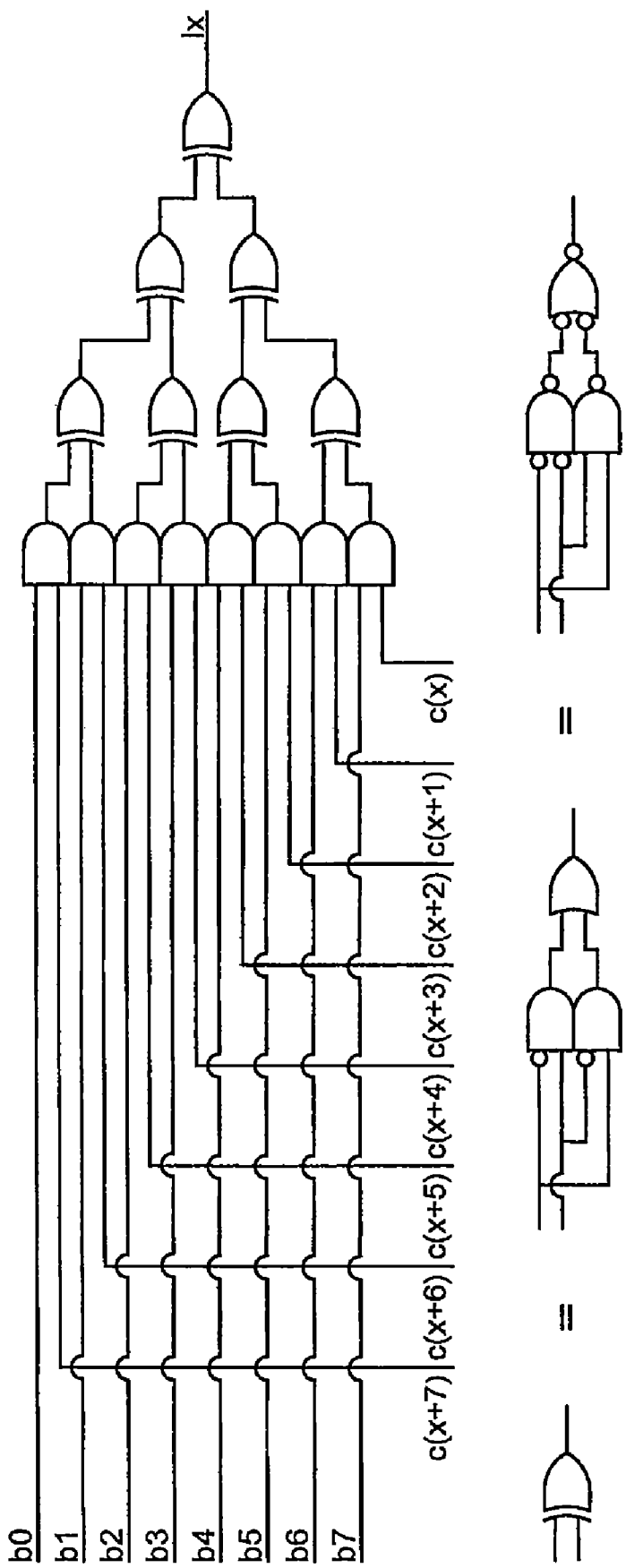
FIG. 16 is a simplified block diagram illustrating an exemplary embodiment of a shifter in accordance with the present invention.

The special purpose shifter is shown in FIG. 16. The shifter operates on an input byte b[7:0] in a single cycle based on the control bits c[14:0] to compute the output i[7:0]. The control bus c is sourced from the 16-bit R-control with the -16-bit c[15] being used in the expander as will be explained below. There are two (2) shifter expanders in the RBN EU which compute the 16-bit output buses S1 and S2.

Figure 17:
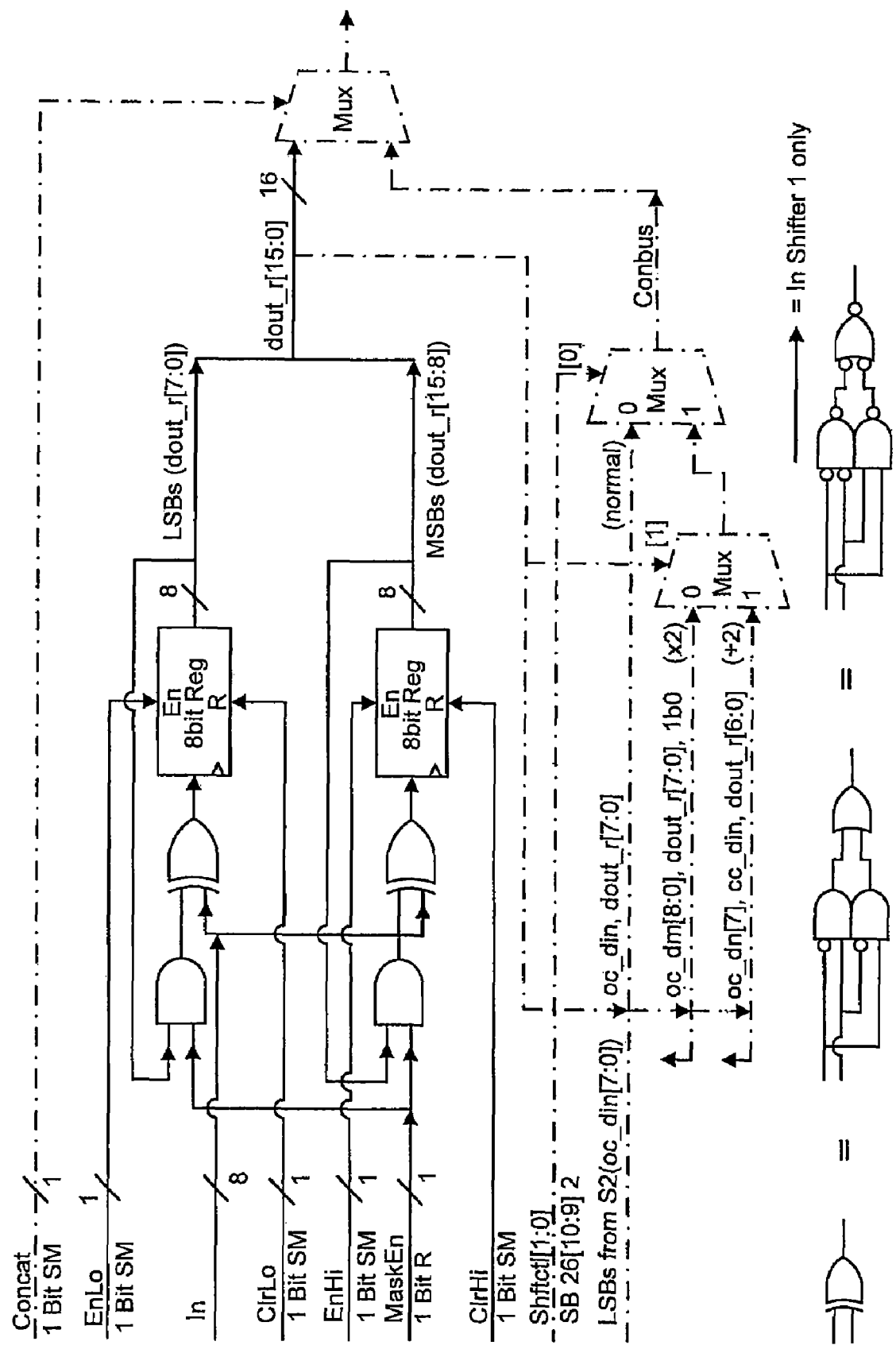
FIG. 17 is a simplified block diagram illustrating an expander in accordance with one exemplary embodiment of the present invention.

The standard operation of the expander, shown in FIG. 17, is to accept the eight (8) bit output of the associated shifter (In[7:0]) and by using state bits (enable hi (enhi), enable lo (enlo), clear hi (clrhi), clear lo (clrlo)) and the MSB of the R-control (c[15] or masken), compute the outputs of two 8-bit registers which are merged to for the 16-bit output bus S1 or S2.

The first expander (S1) performs three (3) functions beyond its standard operation. These operations are enabled by the state bit (concat). When concat is lo, normal mode is used; when concat is hi, the two (2) shifter control bits (shftctl[1:0]) (bits [10:9] of location 26) are used to determine which of the three (3) functions is performed. The first function (shiftctl=00 or 10) is a simple concatenation of the eight (8) LS bits from shifter 2 (S2) to become the MS (most significant) eight (8) bits of shifter 1 (S1). The second function (shiftctl=01) is a concatenation of the seven (7) LS (least significant) bits from shifter 2 (S2) to become the MS (most significant) seven (7) bits of shifter 1 (S1), while the eight (8) LS (least significant) bits of shifter 1 are concatenated with an LSB (least significant bit) of zero (0) to form the nine (9) LSBs of S1. The third function (shiftctl=11) is a function of the eight (8) LS bits from shifter 2 (S2) which are sign extended by one (1) bit to become the MS nine (9) bits of shifter 1 (S1), while the MS seven (7) bits of the eight (8) LS bits of shifter 1 ([7:1]) form the seven (7) LSBs of S1.

Figure 18:
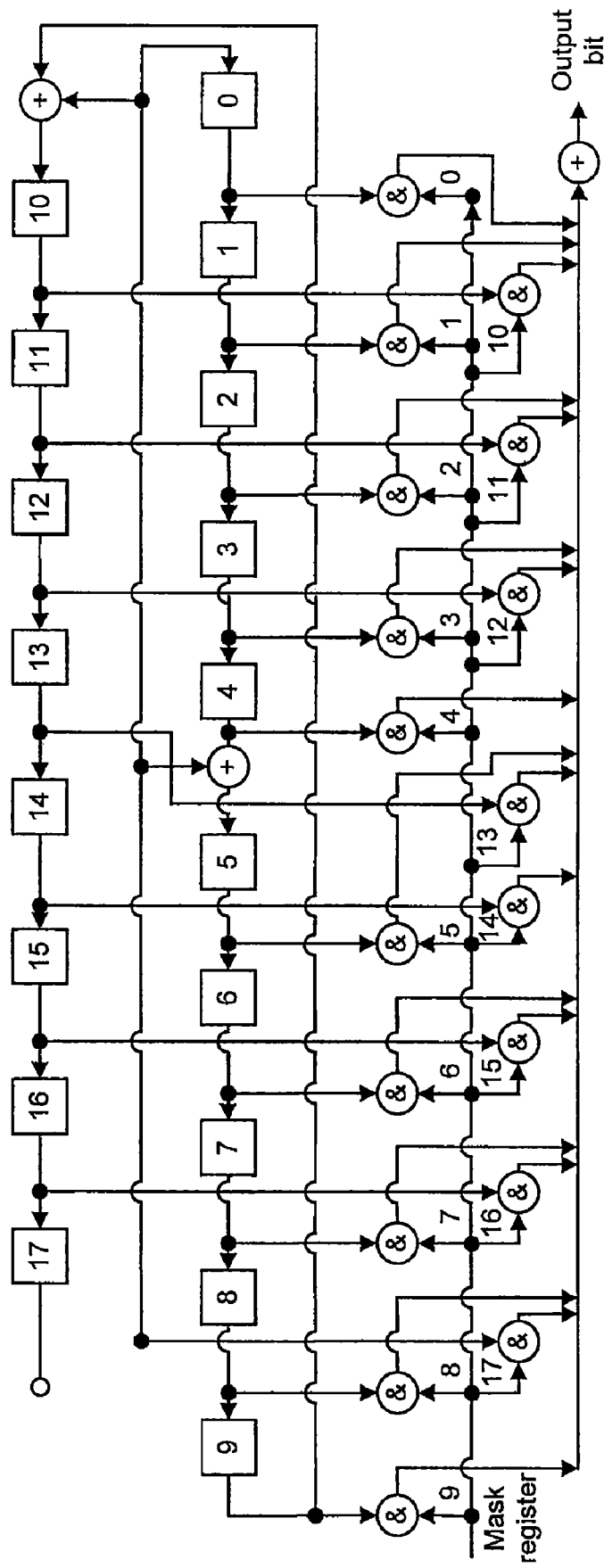
FIG. 18 is a simplified block diagram illustrating an exemplary embodiment of a maskable LFSR in accordance with the present invention.

Some applications (most notably W-CDMA) have requirements for a more complicated LFSR function. These maskable LFSRs apply a programmable mask register (m) to the LFSR state (r). The resulting bits are XORed to produce a single bit per clock. FIG. 18 illustrates this for a sample maskable LFSR.

Table 3 indicates the state of this LFSR after each of eight (8) consecutive clocks. From Table 3, it can be seen that if mask bit 17 (m17) is set then on clock 1, r16 will be part of the first bit of the output. It follows that on clock 2, r15 will be part of the second bit of the output, and that on clock 3, r14 will be part of the third bit of the output, etc. This maps well to the programmable shifter until the eighth bit. For the eighth bit, the input bit r9 is combined with b0. Bit r9 is not available in the first 8 bits r(17:10) and bit b0 is in a separate word all together. In fact, since there are four input words in all: r(17:10), r(9:2), r(1:0) and b(7:0). This means that the solution will require four shifter passes per eight bits of the output along with the three shifter passes (one for each eight bits of the LFSR (r)) for the 18 bit LFSR update. Table 4 shows the control necessary to provide the LFSR update. Table 5 shows the desired bits for the output given the setting of any bit of the mask register m. More than one mask bit is likely to be set at a time so more than one row of this table will be active at a time. Table 6 shows the control bits which need to be set to achieve the output specified in Table 5. As in Table 5, multiple rows of Table 6 are likely to be active at one time.

Since the LFSR functionality and the shifter implementation are easily parallelized, an 18-bit LFSR with the maskable output could be implemented in several ways depending on the desired performance. For example, if it is desired to run at top speed, then seven shifters can implement the function in one clock cycle. If one shifter is used, it will require seven clock cycles to implement the function.

TABLE 3

Eight Consecutive Shifts for Maskable Output

Mask Register:

| | 17 | 16 | 15 | 14 | 13 | 12 | 11 | 10 | 09 | 08 | 07 | 06 | 05 | 04 | 03 | 02 | 01 | 00 |
|---|---|---|---|---|---|---|---|---|---|---|---|---|---|---|---|---|---|---|
| Time 1: | 16 | 15 | 14 | 13 | 12 | 11 | 10 | 09 | 08 | 07 | 06 | 05 | 04 | 03 | 02 | 01 | 00 | |
| | | | | | | | | b0 | | | | | b0 | | | | | b0 |
| Time 2: | 15 | 14 | 13 | 12 | 11 | 10 | 09 | 08 | 07 | 06 | 05 | 04 | 03 | 02 | 01 | 00 | | |
| | | | | | | | b0 | b1 | | | | b0 | b1 | | | | b0 | b1 |
| Time 3: | 14 | 13 | 12 | 11 | 10 | 09 | 08 | 07 | 06 | 05 | 04 | 03 | 02 | 01 | 00 | | | |
| | | | | | | b0 | b1 | b2 | | | b0 | b1 | b2 | | | b0 | b1 | b2 |
| Time 4: | 13 | 12 | 11 | 10 | 09 | 08 | 07 | 06 | 05 | 04 | 03 | 02 | 01 | 00 | | | | |
| | | | | | b0 | b1 | b2 | b3 | | b0 | b1 | b2 | b3 | | b0 | b1 | b2 | b3 |
| Time 5: | 12 | 11 | 10 | 09 | 08 | 07 | 06 | 05 | 04 | 03 | 02 | 01 | 00 | | | | | |
| | | | | b0 | b1 | b2 | b3 | b4 | b0 | b1 | b2 | b3 | b4 | b0 | b1 | b2 | b3 | b4 |
| Time 6: | 11 | 10 | 09 | 08 | 07 | 06 | 05 | 04 | 03 | 02 | 01 | 00 | | | | | | |
| | | | b0 | b1 | b2 | b3 | b4 | b5 | | | | | b0 | b1 | b2 | b3 | b4 | b5 |
| | | | | | | | b0 | b1 | b2 | b3 | b4 | b5 | | | | | | |
| Time 7: | 10 | 09 | 08 | 07 | 06 | 05 | 04 | 03 | 02 | 01 | 00 | | | | | | | |
| | | b0 | b1 | b2 | b3 | b4 | b5 | b6 | | | b0 | b1 | b2 | b3 | b4 | b5 | b6 | |
| | | | | | | b0 | b1 | b2 | b3 | b4 | b5 | b6 | | | | | | |
| Time 8: | 09 | 08 | 07 | 06 | 05 | 04 | 03 | 02 | 01 | 00 | | | | | | | | |
| | b0 | b1 | b2 | b3 | b4 | b5 | b6 | b7 | | b0 | b1 | b2 | b3 | b4 | b5 | b6 | b7 | |
| | | | | | b0 | b1 | b2 | b3 | b4 | b5 | b6 | b7 | | | | | | |

TABLE 4

Update bits Maskable LFSR

| Output (new r) | Input (old r) | Update bits (u) | Byte, Bit | Control Bits |
|---|---|---|---|---|
| R(17) | R(9) | B0 | 0, 0 | C7(B0), C12(−) |
| R(16) | R(8) | B1 | 0, 1 | C7(B1), C12(−) |
| R(15) | R(7) | B2 | 0, 2 | C7(B2), C12(−) |
| R(14) | R(6) | B3 | 0, 3 | C7(B3), C12(−) |
| R(13) | R(5) | B4 | 0, 4 | C7(B4), C12(−) |
| R(12) | R(4) | B5, B0 | 0, 5 | C7(B5), C12(B0) |
| R(11) | R(3) | B6, B1 | 0, 6 | C7(B6), C12(B1) |
| R(10) | R(2) | B7, B2 | 0, 7 | C7(B7), C12(B2) |
| R(9) | R(1) | B3 | 1, 0 | C4(B3), C9(−), |
| R(8) | R(0) | B4 | 1, 1 | C4(B4), C9(−), |
| R(7) | — | B5, B0 | 1, 2 | C4(B5), C9(B0), |
| R(6) | — | B6, B1 | 1, 3 | C4(B6), C9(B1), |
| R(5) | — | B7, B2 | 1, 4 | C4(B7), C9(B2), |
| R(4) | — | B3 | 1, 5 | C4(−), C9(B3), |
| R(3) | — | B4 | 1, 6 | C4(−), C9(B4), |
| R(2) | — | B5 | 1, 7 | C4(−), C9(B5), |
| R(1) | — | B6 | 2, 0 | C1(B6) |
| R(0) | — | B7 | 2, 1 | C1(B7) |

TABLE 5

Output bits of the Maskable LFSR

| Mask Bit(m) | Shifter 1: R(17:10) | Shifter 2: R(9:2) | Shifter 3: R(1:0), 000000 | Shifter 4: b(0:7) |
|---|---|---|---|---|
| m(17) | R(16:10), 0 | 0000000, R(9) | 00000000 | 0000000, B(0) |
| m(16) | R(15:10), 00 | 000000, R(9:8) | 00000000 | 000000, B(0:1) |
| m(15) | R(14:10), 000 | 00000, R(9:7) | 00000000 | 00000, B(0:2) |
| m(14) | R(13:10), 0000 | 0000, R(9:6) | 00000000 | 0000, B(0:3) |
| m(13) | R(12:10), 00000 | 000, R(9:5) | 00000000 | 000, B(0:4) |
| m(12) | R(11:10), 000000 | 00, R(9:4) | 00000000 | 00, B(0:5) @ 0000000, B(0) |
| m(11) | R(10), 0000000 | 0, R(9:3) | 00000000 | 0, B(0:6) @ 000000, B(0:1) |
| m(10) | 00000000 | R(9:2) | 00000000 | B(0:7) @ 00000, B(0:2) |

TABLE 5-continued

Output bits of the Maskable LFSR

| Mask Bit(m) | Shifter 1: R(17:10) | Shifter 2: R(9:2) | Shifter 3: R(1:0), 000000 | Shifter 4: b(0:7) |
|---|---|---|---|---|
| m(9) | 00000000 | R(8:2), 0 | 0000000, R(1) | 0000, B(0:3) |
| m(8) | 00000000 | R(7:2), 00 | 000000, R(1:0) | 000, B(0:4) |
| m(7) | 00000000 | R(6:2), 000 | 00000, R(1:0), 0 | 00, B(0:5) @ 0000000, B(0) |
| m(6) | 00000000 | R(5:2), 0000 | 0000, R(1:0), 00 | 0, B(0:6) @ 000000, B(0:1) |
| m(5) | 00000000 | R(4:2), 00000 | 000, R(1:0), 000 | B(0:7) @ 00000, B(0:2) |
| m(4) | 00000000 | R(3:2), 000000 | 00, R(1:0), 0000 | 0000, B(0:3) |
| m(3) | 00000000 | R(2), 0000000 | 0, R(1:0), 00000 | 000, B(0:4) |
| m(2) | 00000000 | 00000000 | R(1:0), 000000 | 00, B(0:5) |
| m(1) | 00000000 | 00000000 | R(0), 0000000 | 0, B(0:6) |
| m(0) | 00000000 | 00000000 | 00000000 | B(0:7) |

TABLE 6

Control bits for the Maskable LFSR

| Mask Bit (m) | Shifter 1: R(17:10) | Shifter 2: R(9:2) | Shifter 3: R(1:0), 000000 | Shifter 4: b(0:7) | Byte, Bit |
|---|---|---|---|---|---|
| m(17) | C(6) | C(14) | — | C(14) | 0, 0 |
| m(16) | C(5) | C(13) | — | C(13) | 0, 1 |
| m(15) | C(4) | C(12) | — | C(12) | 0, 2 |
| m(14) | C(3) | C(11) | — | C(11) | 0, 3 |
| m(13) | C(2) | C(10) | — | C(10) | 0, 4 |
| m(12) | C(1) | C(9) | — | C(9), C(14) | 0, 5 |
| m(11) | C(0) | C(8) | — | C(8), C(13) | 0, 6 |
| m(10) | — | C(7) | — | C(7), C(12) | 0, 7 |
| m(9) | — | C(6) | C(14) | C(11) | 1, 0 |
| m(8) | — | C(5) | C(13) | C(10) | 1, 1 |
| m(7) | — | C(5) | C(12) | C(9), C(14) | 1, 2 |
| m(6) | — | C(3) | C(11) | C(8), C(13) | 1, 3 |
| m(5) | — | C(2) | C(10) | C(7), C(12) | 1, 4 |
| m(4) | — | C(1) | C(9) | C(11) | 1, 5 |
| m(3) | — | C(0) | C(8) | C(10) | 1, 6 |
| m(2) | — | — | C(7) | C(9) | 1, 7 |
| m(1) | — | — | C(6) | C(8) | 2, 0 |
| m(0) | — | — | — | C(7) | 2, 1 |

In one exemplary embodiment, the shifter is part of a set of elements that can be programmed to implement any LFSR. The byte-oriented version of the shifter can be used in the RBN 10. This version will perform eight bits of the LFSR per clock cycle which, obviously, is the maximum rate possible for a byte-oriented version. The byte-oriented version requires seven XOR gates and eight AND gates per bit. Each XOR gate is implemented with three gates. So, the total per bit gate count for the shifter is 8+(3×7) or 8+21 or 29 gates per bit. This results in 8×29 or 232 total gates for the shifter.

Fifteen (15) control bits are used to operate the shifter. Some of these control bits typically may need to be changed each clock cycle. The control bits can be sourced from a command word, a control state machine or from a Look Up Table (LUT) RAM. The RAM is 256×16 and is, in this case addressed by a state machine. The 256×16 RAM can be used to provide the control for an LFSR of up to 2048 bits.

In one exemplary implementation, the present invention is implemented with control logic using computer software in either an integrated or modular manner or hardware or a combination of both. However, it should be understood that based on the disclosure and teachings provided herein, a person of ordinary skill in the art will know of other ways and/or methods to implement the present invention.

It is understood that the examples and embodiments described herein are for illustrative purposes only and that various modifications or changes in light thereof will be suggested to persons skilled in the art and are to be included within the spirit and purview of this application and scope of the appended claims. Accordingly, the disclosures and descriptions herein are intended to be illustrative, but not limiting, of the scope of the invention which is set forth in the following claims.

What is claimed is:

1. A programmable data combiner comprising:
   a plurality of registers configured to receive a 16-bit or less input from a first source and a 5-bit or less input from a second source and to generate a first 20-bit or less output based on the 16-bit or less input from the first source and the 5-bit or less input from the second source; and
   a selector configured to receive a mode signal, a first set of one or more control signals capable of modifying an output word length, and the first 20-bit or less output and to select 4 bits or less from the first 20-bit or less output to generate a first selection of 4 bits or less based on the mode signal and the first set of one or more control signals; and
   a filler configured to receive and combine the 16-bit or less input from the first source, a 16-bit or less input from a third source, and the 4 bits or less selection output by the selector to generate a 32-bit or less output based on a second set of control signals capable of modifying an output word length.

2. The programmable data combiner of claim 1, wherein the plurality of registers is configured to perform a data packing operation when generating the 20-bit or less output based on the 16-bit or less input from the first source and the 5-bit or less input from the second source.

3. The programmable data combiner of claim 2, wherein the selector is configured to select and puncture bits from the first 20-bit or less output from the plurality of registers when generating the 4 bits or less selection based on the first set of control signals and the mode signal.

* * * * *